(12) United States Patent
Brandenburg et al.

(10) Patent No.: US 12,058,804 B2
(45) Date of Patent: Aug. 6, 2024

(54) FORMED WAVEGUIDE ANTENNAS OF A RADAR ASSEMBLY

(71) Applicant: Aptiv Technologies AG, Schaffhausen (CH)

(72) Inventors: Scott D. Brandenburg, Kokomo, IN (US); David Wayne Zimmerman, Noblesville, IN (US)

(73) Assignee: Aptiv Technologies AG, Schaffhausen (CH)

(*) Notice: Subject to any disclaimer, the term of this patent is extended or adjusted under 35 U.S.C. 154(b) by 596 days.

(21) Appl. No.: 17/306,868

(22) Filed: May 3, 2021

(65) Prior Publication Data

US 2022/0256685 A1 Aug. 11, 2022

Related U.S. Application Data

(60) Provisional application No. 63/147,657, filed on Feb. 9, 2021.

(51) Int. Cl.
*G01S 7/02* (2006.01)
*G01S 7/03* (2006.01)
(Continued)

(52) U.S. Cl.
CPC ............ *H05K 1/0206* (2013.01); *G01S 7/028* (2021.05); *G01S 7/032* (2013.01); *G01S 13/931* (2013.01);
(Continued)

(58) Field of Classification Search
CPC ............... H05K 1/0206; H05K 1/0243; H05K 2201/10098; G01S 7/028; G01S 7/032; G01S 13/931; H01Q 1/02; H01Q 13/106
(Continued)

(56) References Cited

U.S. PATENT DOCUMENTS

| 2,851,686 A | 9/1958 | Hagaman |
| 3,029,432 A | 4/1962 | Hansen |

(Continued)

FOREIGN PATENT DOCUMENTS

| CA | 2654470 | 12/2007 |
| CN | 1254446 A | 5/2000 |

(Continued)

OTHER PUBLICATIONS

Howard Hausman ("Termination Insensitive mixers", Nov. 7, 2011, XP032076229) (Year: 2011).*

(Continued)

*Primary Examiner* — Nuzhat Pervin
(74) *Attorney, Agent, or Firm* — Harness, Dickey & Pierce, P.L.C.

(57) ABSTRACT

Formed waveguide antennas using one or metal sheets can improve the materials and manufacturing process of a radar assembly. For example, the radar system can include a printed circuit board (PCB) and a metal sheet attached to the PCB. The metal sheet can be formed to provide multiple waveguide antennas that each include multiple waveguide channels. Multiple radiation slots can be formed on a surface of each of the multiple waveguide channels. The PCB can include an MIMIC and a thermally conductive material covering a portion of a first and a second surface of the PCB. The metal sheet can also be formed to provide a shield for the MIMIC. In this way, the described techniques and systems permit the waveguide antennas to formed with materials and a manufacturing process that reduce costs while still providing high performance (e.g., minimized loss).

20 Claims, 9 Drawing Sheets

(51) Int. Cl.
  *G01S 13/931* (2020.01)
  *H01Q 1/02* (2006.01)
  *H01Q 13/10* (2006.01)
  *H05K 1/02* (2006.01)

(52) U.S. Cl.
  CPC ............ *H01Q 1/02* (2013.01); *H01Q 13/106* (2013.01); *H05K 1/0243* (2013.01); *H05K 2201/10098* (2013.01)

(58) Field of Classification Search
  USPC ....................................................... 342/175
  See application file for complete search history.

(56) References Cited

U.S. PATENT DOCUMENTS

| | | | |
|---|---|---|---|
| 3,032,762 A | | 5/1962 | Kerr |
| 3,328,800 A | | 6/1967 | Algeo |
| 3,462,713 A | | 8/1969 | Knerr |
| 3,473,162 A | | 10/1969 | Veith |
| 3,579,149 A | | 5/1971 | Ramsey |
| 3,594,806 A | | 7/1971 | Black et al. |
| 3,597,710 A | | 8/1971 | Levy |
| 3,852,689 A | | 12/1974 | Watson |
| 4,157,516 A | | 6/1979 | Van De Grijp |
| 4,291,312 A | | 9/1981 | Kaloi |
| 4,453,142 A | | 6/1984 | Murphy |
| 4,562,416 A | | 12/1985 | Sedivec |
| 4,590,480 A | | 5/1986 | Nikolayuk et al. |
| 4,839,663 A | | 6/1989 | Kurtz |
| 5,030,965 A | | 7/1991 | Park et al. |
| 5,047,738 A | | 9/1991 | Wong et al. |
| 5,065,123 A | | 11/1991 | Heckaman et al. |
| 5,068,670 A | | 11/1991 | Maoz |
| 5,077,546 A | * | 12/1991 | Carfi ........................ H03B 19/18 327/119 |
| 5,113,197 A | | 5/1992 | Luh |
| 5,293,171 A | * | 3/1994 | Cherrette ............... H01Q 1/002 343/DIG. 2 |
| 5,337,065 A | | 8/1994 | Bonnet et al. |
| 5,350,499 A | | 9/1994 | Shibaike et al. |
| 5,541,612 A | | 7/1996 | Josefsson |
| 5,638,079 A | | 6/1997 | Kastner et al. |
| 5,923,225 A | | 7/1999 | Santos |
| 5,926,147 A | | 7/1999 | Sehm et al. |
| 5,982,256 A | | 11/1999 | Uchimura et al. |
| 5,986,527 A | | 11/1999 | Ishikawa et al. |
| 6,072,375 A | | 6/2000 | Adkins et al. |
| 6,166,701 A | | 12/2000 | Park et al. |
| 6,414,573 B1 | | 7/2002 | Swineford et al. |
| 6,489,855 B1 | | 12/2002 | Kitamori et al. |
| 6,535,083 B1 | | 3/2003 | Hageman et al. |
| 6,622,370 B1 | | 9/2003 | Sherman et al. |
| 6,788,918 B2 | | 9/2004 | Saitoh et al. |
| 6,794,950 B2 | | 9/2004 | Du Tolt et al. |
| 6,859,114 B2 | | 2/2005 | Eleftheriades et al. |
| 6,867,660 B2 | | 3/2005 | Kitamori et al. |
| 6,958,662 B1 | | 10/2005 | Salmela et al. |
| 6,992,541 B2 | | 1/2006 | Wright et al. |
| 7,002,511 B1 | | 2/2006 | Ammar et al. |
| 7,091,919 B2 | | 8/2006 | Bannon |
| 7,142,165 B2 | | 11/2006 | Sanchez et al. |
| 7,420,442 B1 | | 9/2008 | Forman |
| 7,439,822 B2 | | 10/2008 | Shimura et al. |
| 7,495,532 B2 | | 2/2009 | McKinzie, III |
| 7,498,994 B2 | | 3/2009 | Vacanti |
| 7,626,476 B2 | | 12/2009 | Kim et al. |
| 7,659,799 B2 | | 2/2010 | Jun et al. |
| 7,886,434 B1 | | 2/2011 | Forman |
| 7,973,616 B2 | | 7/2011 | Shijo et al. |
| 7,994,879 B2 | | 8/2011 | Kim et al. |
| 8,013,694 B2 | | 9/2011 | Hiramatsu et al. |
| 8,089,327 B2 | | 1/2012 | Margomenos et al. |
| 8,159,316 B2 | | 4/2012 | Miyazato et al. |
| 8,305,255 B2 | * | 11/2012 | Margomenos ........ G01S 13/931 343/700 R |
| 8,395,552 B2 | | 3/2013 | Geiler et al. |
| 8,451,175 B2 | | 5/2013 | Gummalla et al. |
| 8,451,189 B1 | | 5/2013 | Fluhler |
| 8,576,023 B1 | | 11/2013 | Buckley et al. |
| 8,604,990 B1 | | 12/2013 | Chen et al. |
| 8,692,731 B2 | | 4/2014 | Lee et al. |
| 8,717,124 B2 | | 5/2014 | Vanhille et al. |
| 8,803,638 B2 | | 8/2014 | Kildal |
| 8,948,562 B2 | | 2/2015 | Norris et al. |
| 9,007,269 B2 | | 4/2015 | Lee et al. |
| 9,172,145 B2 | * | 10/2015 | Puzella ................ H05K 1/0206 |
| 9,203,139 B2 | | 12/2015 | Zhu et al. |
| 9,203,155 B2 | | 12/2015 | Choi et al. |
| 9,246,204 B1 | | 1/2016 | Kabakian |
| 9,258,884 B2 | | 2/2016 | Saito |
| 9,356,238 B2 | | 5/2016 | Norris et al. |
| 9,368,878 B2 | | 6/2016 | Chen et al. |
| 9,450,281 B2 | | 9/2016 | Kim |
| 9,488,719 B2 | * | 11/2016 | Schmalenberg ........ G01S 13/02 |
| 9,537,212 B2 | | 1/2017 | Rosen et al. |
| 9,647,313 B2 | | 5/2017 | Marconi et al. |
| 9,653,773 B2 | | 5/2017 | Ferrari et al. |
| 9,653,819 B1 | * | 5/2017 | Izadian .............. H01Q 21/0087 |
| 9,673,532 B2 | | 6/2017 | Cheng et al. |
| 9,806,393 B2 | | 10/2017 | Kildal et al. |
| 9,806,431 B1 | | 10/2017 | Izadian |
| 9,813,042 B2 | | 11/2017 | Xue et al. |
| 9,843,301 B1 | | 12/2017 | Rodgers et al. |
| 9,882,288 B2 | | 1/2018 | Black et al. |
| 9,935,065 B1 | | 4/2018 | Baheti et al. |
| 9,991,606 B2 | | 6/2018 | Kirino et al. |
| 9,997,842 B2 | | 6/2018 | Kirino et al. |
| 10,027,032 B2 | | 7/2018 | Kirino et al. |
| 10,042,045 B2 | | 8/2018 | Kirino et al. |
| 10,090,600 B2 | | 10/2018 | Kirino et al. |
| 10,114,067 B2 | | 10/2018 | Lam et al. |
| 10,153,533 B2 | | 12/2018 | Kirino |
| 10,158,158 B2 | | 12/2018 | Kirino et al. |
| 10,164,318 B2 | | 12/2018 | Seok et al. |
| 10,164,344 B2 | | 12/2018 | Kirino et al. |
| 10,186,787 B1 | | 1/2019 | Wang et al. |
| 10,218,078 B2 | | 2/2019 | Kirino et al. |
| 10,230,173 B2 | | 3/2019 | Kirino et al. |
| 10,263,310 B2 | | 4/2019 | Kildal et al. |
| 10,283,832 B1 | | 5/2019 | Chayat et al. |
| 10,312,596 B2 | | 6/2019 | Gregoire |
| 10,315,578 B2 | | 6/2019 | Kim et al. |
| 10,320,083 B2 | | 6/2019 | Kirino et al. |
| 10,333,227 B2 | | 6/2019 | Kirino et al. |
| 10,374,323 B2 | | 8/2019 | Kamo et al. |
| 10,381,317 B2 | | 8/2019 | Maaskant et al. |
| 10,381,741 B2 | | 8/2019 | Kirino et al. |
| 10,439,298 B2 | | 10/2019 | Kirino et al. |
| 10,468,736 B2 | | 11/2019 | Mangaiahgari |
| 10,505,282 B2 | | 12/2019 | Lilja |
| 10,522,895 B2 | * | 12/2019 | Blech ...................... H01P 3/121 |
| 10,534,061 B2 | | 1/2020 | Vassilev et al. |
| 10,559,889 B2 | | 2/2020 | Kirino et al. |
| 10,594,045 B2 | | 3/2020 | Kirino et al. |
| 10,601,144 B2 | | 3/2020 | Kamo et al. |
| 10,608,345 B2 | | 3/2020 | Kirino et al. |
| 10,613,216 B2 | | 4/2020 | Vacanti et al. |
| 10,622,696 B2 | | 4/2020 | Kamo et al. |
| 10,627,502 B2 | | 4/2020 | Kirino et al. |
| 10,649,461 B2 | | 5/2020 | Han et al. |
| 10,651,138 B2 | | 5/2020 | Kirino et al. |
| 10,651,567 B2 | | 5/2020 | Kamo et al. |
| 10,658,760 B2 | | 5/2020 | Kamo et al. |
| 10,670,810 B2 | | 6/2020 | Sakr et al. |
| 10,705,294 B2 | | 7/2020 | Guerber et al. |
| 10,707,584 B2 | | 7/2020 | Kirino et al. |
| 10,714,802 B2 | | 7/2020 | Kirino et al. |
| 10,727,561 B2 | | 7/2020 | Kirino et al. |
| 10,727,611 B2 | | 7/2020 | Kirino et al. |
| 10,763,590 B2 | | 9/2020 | Kirino et al. |
| 10,763,591 B2 | | 9/2020 | Kirino et al. |
| 10,775,573 B1 | | 9/2020 | Hsu et al. |

(56) References Cited

U.S. PATENT DOCUMENTS

| | | | |
|---|---|---|---|
| 10,811,373 B2 | 10/2020 | Zaman et al. | |
| 10,826,147 B2 | 11/2020 | Sikina et al. | |
| 10,833,382 B2 | 11/2020 | Sysouphat | |
| 10,833,385 B2 | 11/2020 | Mangaiahgari et al. | |
| 10,884,118 B2 * | 1/2021 | Hammerschmidt | G01S 13/931 |
| 10,892,536 B2 | 1/2021 | Fan et al. | |
| 10,944,184 B2 | 3/2021 | Shi et al. | |
| 10,957,971 B2 | 3/2021 | Doyle et al. | |
| 10,957,988 B2 | 3/2021 | Kirino et al. | |
| 10,962,628 B1 | 3/2021 | Laifenfeld et al. | |
| 10,971,824 B2 | 4/2021 | Baumgartner et al. | |
| 10,983,194 B1 | 4/2021 | Patel et al. | |
| 10,985,434 B2 | 4/2021 | Wagner et al. | |
| 10,985,471 B2 * | 4/2021 | Shiozaki | H01Q 9/0407 |
| 10,992,056 B2 | 4/2021 | Kamo et al. | |
| 11,061,110 B2 | 7/2021 | Kamo et al. | |
| 11,088,432 B2 | 8/2021 | Seok et al. | |
| 11,088,464 B2 | 8/2021 | Sato et al. | |
| 11,114,733 B2 | 9/2021 | Doyle et al. | |
| 11,121,441 B1 | 9/2021 | Rmili et al. | |
| 11,121,475 B2 | 9/2021 | Yang et al. | |
| 11,133,594 B2 * | 9/2021 | Ahmadloo | H01Q 13/18 |
| 11,169,325 B2 | 11/2021 | Guerber et al. | |
| 11,171,399 B2 | 11/2021 | Alexanian et al. | |
| 11,183,751 B2 * | 11/2021 | Purden | H01Q 13/06 |
| 11,196,171 B2 | 12/2021 | Doyle et al. | |
| 11,201,414 B2 | 12/2021 | Doyle et al. | |
| 11,249,011 B2 | 2/2022 | Challener | |
| 11,283,162 B2 | 3/2022 | Doyle et al. | |
| 11,289,787 B2 | 3/2022 | Yang | |
| 11,349,183 B2 | 5/2022 | Rahiminejad et al. | |
| 11,349,220 B2 | 5/2022 | Alexanian et al. | |
| 11,378,683 B2 | 7/2022 | Alexanian et al. | |
| 11,411,292 B2 | 8/2022 | Kirino | |
| 11,444,364 B2 | 9/2022 | Shi | |
| 11,495,871 B2 | 11/2022 | Vosoogh et al. | |
| 11,495,881 B1 * | 11/2022 | Harvey | H01Q 1/02 |
| 11,563,259 B2 | 1/2023 | Alexanian et al. | |
| 11,604,273 B2 * | 3/2023 | Wintermantel | H01Q 21/0068 |
| 11,611,138 B2 | 3/2023 | Ogawa et al. | |
| 11,616,282 B2 | 3/2023 | Yao et al. | |
| 11,619,734 B2 * | 4/2023 | Izadian | H01Q 1/3233 342/25 R |
| 11,626,652 B2 | 4/2023 | Vilenskiy et al. | |
| 11,668,817 B2 * | 6/2023 | Vacanti | G01S 13/4463 342/26 B |
| 2002/0021197 A1 | 2/2002 | Elco | |
| 2003/0052828 A1 | 3/2003 | Scherzer et al. | |
| 2004/0041663 A1 | 3/2004 | Uchimura et al. | |
| 2004/0069984 A1 | 4/2004 | Estes et al. | |
| 2004/0090290 A1 | 5/2004 | Teshirogi et al. | |
| 2004/0174315 A1 | 9/2004 | Miyata | |
| 2005/0146474 A1 | 7/2005 | Bannon | |
| 2005/0237253 A1 | 10/2005 | Kuo et al. | |
| 2006/0038724 A1 | 2/2006 | Tikhov et al. | |
| 2006/0113598 A1 | 6/2006 | Chen et al. | |
| 2006/0158382 A1 | 7/2006 | Nagai | |
| 2007/0013598 A1 | 1/2007 | Artis et al. | |
| 2007/0054064 A1 | 3/2007 | Ohmi et al. | |
| 2007/0103381 A1 | 5/2007 | Upton | |
| 2008/0129409 A1 | 6/2008 | Nagaishi et al. | |
| 2008/0150821 A1 | 6/2008 | Koch et al. | |
| 2009/0040132 A1 | 2/2009 | Sridhar et al. | |
| 2009/0207090 A1 | 8/2009 | Pettus et al. | |
| 2009/0243762 A1 | 10/2009 | Chen et al. | |
| 2009/0243766 A1 | 10/2009 | Miyagawa et al. | |
| 2009/0300901 A1 | 12/2009 | Artis et al. | |
| 2010/0134376 A1 * | 6/2010 | Margomenos | H01Q 21/065 343/860 |
| 2010/0321265 A1 | 12/2010 | Yamaguchi et al. | |
| 2011/0181482 A1 | 7/2011 | Adams et al. | |
| 2012/0013421 A1 | 1/2012 | Hayata | |
| 2012/0050125 A1 | 3/2012 | Leiba et al. | |
| 2012/0056776 A1 | 3/2012 | Shijo et al. | |
| 2012/0068316 A1 | 3/2012 | Ligander | |
| 2012/0163811 A1 | 6/2012 | Doany et al. | |
| 2012/0194399 A1 | 8/2012 | Bily et al. | |
| 2012/0242421 A1 | 9/2012 | Robin et al. | |
| 2012/0256796 A1 | 10/2012 | Leiba | |
| 2012/0280770 A1 | 11/2012 | Abhari et al. | |
| 2013/0057358 A1 | 3/2013 | Anthony et al. | |
| 2013/0082801 A1 | 4/2013 | Rofougaran et al. | |
| 2013/0300602 A1 | 11/2013 | Zhou et al. | |
| 2014/0015709 A1 | 1/2014 | Shijo et al. | |
| 2014/0091884 A1 | 4/2014 | Flatters | |
| 2014/0106684 A1 | 4/2014 | Burns et al. | |
| 2014/0327491 A1 | 11/2014 | Kim et al. | |
| 2015/0015453 A1 * | 1/2015 | Puzella | H05K 1/0206 333/1.1 |
| 2015/0035714 A1 * | 2/2015 | Zhou | H01Q 3/26 343/767 |
| 2015/0097633 A1 | 4/2015 | Devries et al. | |
| 2015/0229017 A1 | 8/2015 | Suzuki et al. | |
| 2015/0229027 A1 | 8/2015 | Sonozaki et al. | |
| 2015/0263429 A1 | 9/2015 | Vahidpour et al. | |
| 2015/0333726 A1 | 11/2015 | Xue et al. | |
| 2015/0357698 A1 | 12/2015 | Kushta | |
| 2015/0364804 A1 | 12/2015 | Tong et al. | |
| 2015/0364830 A1 | 12/2015 | Tong et al. | |
| 2016/0043455 A1 | 2/2016 | Seler et al. | |
| 2016/0049714 A1 | 2/2016 | Ligander et al. | |
| 2016/0056541 A1 | 2/2016 | Tageman et al. | |
| 2016/0118705 A1 | 4/2016 | Tang et al. | |
| 2016/0126637 A1 | 5/2016 | Uemichi | |
| 2016/0195612 A1 | 7/2016 | Shi | |
| 2016/0204495 A1 | 7/2016 | Takeda et al. | |
| 2016/0211582 A1 | 7/2016 | Saraf | |
| 2016/0276727 A1 | 9/2016 | Dang et al. | |
| 2016/0293557 A1 | 10/2016 | Topak et al. | |
| 2016/0301125 A1 | 10/2016 | Kim et al. | |
| 2017/0003377 A1 | 1/2017 | Menge | |
| 2017/0012335 A1 | 1/2017 | Boutayeb | |
| 2017/0084554 A1 | 3/2017 | Dogiamis et al. | |
| 2017/0288313 A1 | 10/2017 | Chung et al. | |
| 2017/0294719 A1 | 10/2017 | Tatomir | |
| 2017/0324135 A1 | 11/2017 | Blech et al. | |
| 2018/0013208 A1 | 1/2018 | Izadian et al. | |
| 2018/0026378 A1 * | 1/2018 | Hadavy | H01Q 21/0087 343/771 |
| 2018/0032822 A1 | 2/2018 | Frank et al. | |
| 2018/0123245 A1 | 5/2018 | Toda et al. | |
| 2018/0131084 A1 | 5/2018 | Park et al. | |
| 2018/0212324 A1 | 7/2018 | Tatomir | |
| 2018/0226709 A1 | 8/2018 | Mangaiahgari | |
| 2018/0231635 A1 * | 8/2018 | Woehlte | H01Q 21/0006 |
| 2018/0233465 A1 | 8/2018 | Spella et al. | |
| 2018/0254563 A1 | 9/2018 | Sonozaki et al. | |
| 2018/0284186 A1 | 10/2018 | Chadha et al. | |
| 2018/0301819 A1 | 10/2018 | Kirino et al. | |
| 2018/0301820 A1 | 10/2018 | Bregman et al. | |
| 2018/0343711 A1 | 11/2018 | Wixforth et al. | |
| 2018/0351261 A1 | 12/2018 | Kamo et al. | |
| 2018/0358681 A1 * | 12/2018 | Bosshard | H01P 5/12 |
| 2018/0375185 A1 | 12/2018 | Kirino et al. | |
| 2019/0006743 A1 | 1/2019 | Kirino et al. | |
| 2019/0013563 A1 | 1/2019 | Takeda et al. | |
| 2019/0057945 A1 | 2/2019 | Maaskant et al. | |
| 2019/0109361 A1 | 4/2019 | Ichinose et al. | |
| 2019/0115644 A1 | 4/2019 | Wang et al. | |
| 2019/0187247 A1 | 6/2019 | Izadian et al. | |
| 2019/0190115 A1 * | 6/2019 | Samardzija | H01Q 9/42 |
| 2019/0245276 A1 | 8/2019 | Li et al. | |
| 2019/0252778 A1 | 8/2019 | Duan | |
| 2019/0260137 A1 | 8/2019 | Watanabe et al. | |
| 2019/0324134 A1 | 10/2019 | Cattle | |
| 2020/0021001 A1 | 1/2020 | Mangaiahgairi | |
| 2020/0044360 A1 | 2/2020 | Kamo et al. | |
| 2020/0059002 A1 | 2/2020 | Renard et al. | |
| 2020/0064483 A1 | 2/2020 | Li et al. | |
| 2020/0076086 A1 | 3/2020 | Cheng et al. | |
| 2020/0106171 A1 | 4/2020 | Shepeleva et al. | |
| 2020/0112077 A1 | 4/2020 | Kamo et al. | |
| 2020/0137884 A1 * | 4/2020 | Markish | G01S 7/028 |
| 2020/0166637 A1 * | 5/2020 | Hess | G01S 7/032 |

(56) References Cited

U.S. PATENT DOCUMENTS

| | | |
|---|---|---|
| 2020/0203849 A1 | 6/2020 | Lim et al. |
| 2020/0212594 A1 | 7/2020 | Kirino et al. |
| 2020/0235453 A1 | 7/2020 | Lang |
| 2020/0284907 A1 | 9/2020 | Gupta et al. |
| 2020/0287293 A1 | 9/2020 | Shi et al. |
| 2020/0319293 A1 | 10/2020 | Kuriyama et al. |
| 2020/0343612 A1 | 10/2020 | Shi |
| 2020/0346581 A1 | 11/2020 | Lawson et al. |
| 2020/0373678 A1 | 11/2020 | Park et al. |
| 2021/0028528 A1 | 1/2021 | Alexanian et al. |
| 2021/0036393 A1 | 2/2021 | Mangaiahgari |
| 2021/0104818 A1 | 4/2021 | Li et al. |
| 2021/0110217 A1 | 4/2021 | Gunel |
| 2021/0159577 A1 | 5/2021 | Carlred et al. |
| 2021/0218154 A1 | 7/2021 | Shi et al. |
| 2021/0242581 A1 | 8/2021 | Rossiter et al. |
| 2021/0249777 A1 | 8/2021 | Alexanian et al. |
| 2021/0305667 A1 | 9/2021 | Bencivenni |
| 2022/0094071 A1 | 3/2022 | Doyle et al. |
| 2022/0109246 A1 | 4/2022 | Emanuelsson et al. |
| 2022/0189894 A1* | 6/2022 | Zanati .................... H01L 23/552 |
| 2022/0196794 A1 | 6/2022 | Foroozesh et al. |
| 2022/0216166 A1* | 7/2022 | Öjefors ............. H01L 23/49816 |
| 2023/0253717 A1* | 8/2023 | Petersson ................. H01P 3/123 |
| | | 343/702 |

FOREIGN PATENT DOCUMENTS

| | | | |
|---|---|---|---|
| CN | 1620738 | 5/2005 | |
| CN | 2796131 | 7/2006 | |
| CN | 101584080 A | 11/2009 | |
| CN | 201383535 | 1/2010 | |
| CN | 201868568 U | 6/2011 | |
| CN | 102157787 A | 8/2011 | |
| CN | 102420352 A | 4/2012 | |
| CN | 103326125 A | 9/2013 | |
| CN | 203277633 U | 11/2013 | |
| CN | 103490168 A | 1/2014 | |
| CN | 103515682 | 1/2014 | |
| CN | 102142593 B | 6/2014 | |
| CN | 104101867 A | 10/2014 | |
| CN | 104900956 | 9/2015 | |
| CN | 104993254 A | 10/2015 | |
| CN | 105071019 A | 11/2015 | |
| CN | 105409056 A * | 3/2016 | .......... G01S 13/931 |
| CN | 105609909 | 5/2016 | |
| CN | 105680133 | 6/2016 | |
| CN | 105958167 | 9/2016 | |
| CN | 107317075 A | 11/2017 | |
| CN | 108258392 A | 7/2018 | |
| CN | 109286081 A | 1/2019 | |
| CN | 109643856 A | 4/2019 | |
| CN | 109980361 A | 7/2019 | |
| CN | 110085990 A | 8/2019 | |
| CN | 209389219 | 9/2019 | |
| CN | 110401022 A | 11/2019 | |
| CN | 111123210 A | 5/2020 | |
| CN | 111480090 A | 7/2020 | |
| CN | 108376821 B | 10/2020 | |
| CN | 110474137 B | 11/2020 | |
| CN | 109326863 B | 12/2020 | |
| CN | 112241007 A | 1/2021 | |
| CN | 212604823 U | 2/2021 | |
| CN | 112986951 A | 6/2021 | |
| CN | 112290182 B | 7/2021 | |
| CN | 113193323 B | 10/2021 | |
| CN | 214706247 U | 11/2021 | |
| DE | 112017006415 | 9/2019 | |
| DE | 102019200893 | 7/2020 | |
| EP | 0174579 A2 | 3/1986 | |
| EP | 0818058 A1 | 1/1998 | |
| EP | 2267841 A1 | 12/2010 | |
| EP | 2500978 | 9/2012 | |
| EP | 2843758 | 3/2015 | |
| EP | 3252500 A2 * | 12/2017 | ......... G01S 13/4463 |
| EP | 2766224 B1 | 12/2018 | |
| EP | 3460903 | 3/2019 | |
| EP | 3785995 A1 | 3/2021 | |
| EP | 3862773 A1 | 8/2021 | |
| EP | 4089840 A1 | 11/2022 | |
| GB | 893008 A | 4/1962 | |
| GB | 2463711 A | 3/2010 | |
| GB | 2489950 | 10/2012 | |
| JP | 2000183222 A * | 6/2000 | ............ H01L 23/12 |
| JP | 2000183222 A | 6/2000 | |
| JP | 2003198242 A | 7/2003 | |
| JP | 2003289201 | 10/2003 | |
| JP | 5269902 B2 | 8/2013 | |
| JP | 2013187752 A | 9/2013 | |
| JP | 2015216533 A | 12/2015 | |
| KR | 100846872 | 5/2008 | |
| KR | 20080044752 A | 5/2008 | |
| KR | 1020080044752 A | 5/2008 | |
| KR | 101092846 B1 | 12/2011 | |
| KR | 102154338 B1 | 9/2020 | |
| WO | 9934477 A1 | 7/1999 | |
| WO | 2013189513 | 12/2013 | |
| WO | 2018003932 | 1/2018 | |
| WO | 2018052335 A1 | 3/2018 | |
| WO | WO-2018052335 A1 * | 3/2018 | ................ H01P 3/12 |
| WO | 2019085368 A1 | 5/2019 | |
| WO | 2020082363 A1 | 4/2020 | |
| WO | 2021072380 A1 | 4/2021 | |
| WO | 2022122319 A1 | 6/2022 | |
| WO | 2022225804 A1 | 10/2022 | |

OTHER PUBLICATIONS

Yu Yingrui et al. ("Optimization and Implementation of SIW Slot Array for Both Medium and Long Range 77 GHz Automotive Radar Application", Jul. 1, 2018, XP011686356) (Year: 2018).*

Aulia Dewantari et al., "Flared SIW antenna design and transceiving experiments for W-band SAR", International Journal of RF and Microwave Computer-Aided Engineering, Wiley Interscience, Hoboken, USA, vol. 28, No. 9, May 9, 2018, XP072009558.

"Foreign Office Action", CN Application No. 201810122408.4, Oct. 18, 2021, 19 pages.

"Non-Final Office Action", U.S. Appl. No. 16/829,409, filed Oct. 14, 2021, 13 pages.

"Non-Final Office Action", U.S. Appl. No. 17/061,675, filed Dec. 20, 2021, 4 pages.

Wang, et al., "Mechanical and Dielectric Strength of Laminated Epoxy Dielectric Graded Materials", Mar. 2020, 15 pages.

"Extended European Search Report", EP Application No. 20155296.5, Jul. 13, 2020, 12 pages.

"Extended European Search Report", EP Application No. 21212703.9, May 3, 2022, 13 pages.

"Extended European Search Report", EP Application No. 21215901.6, Jun. 9, 2022, 8 pages.

"Extended European Search Report", EP Application No. 22160898.7, Aug. 4, 2022, 11 pages.

"Extended European Search Report", EP Application No. 22183888.1, Dec. 20, 2022, 10 pages.

"Extended European Search Report", EP Application No. 22183892.3, Dec. 2, 2022, 8 pages.

"Extended European Search Report", EP Application No. 22184924.3, Dec. 2, 2022, 13 pages.

"Foreign Office Action", CN Application No. 202010146513.9, Feb. 7, 2022, 14 pages.

Bauer, et al., "A wideband transition from substrate integrated waveguide to differential microstrip lines in multilayer substrates", Sep. 2010, pp. 811-813.

Chaloun, et al., "A Wideband 122 GHz Cavity-Backed Dipole Antenna for Millimeter-Wave Radar Altimetry", 2020 14th European Conference on Antennas and Propagation (EUCAP), Mar. 15, 2020, 4 pages.

Deutschmann, et al., "A Full W-Band Waveguide-to-Differential Microstrip Transition", Jun. 2019, pp. 335-338.

(56) References Cited

OTHER PUBLICATIONS

Furtula, et al., "Waveguide Bandpass Filters for Millimeter-Wave Radiometers", Journal of Infrared, Millimeter and Terahertz Waves, 2013, 9 pages.
Giese, et al., "Compact Wideband Single-ended and Differential Microstrip-to-waveguide Transitions at W-band", Jul. 2015, 4 pages.
Hansen, et al., "D-Band FMCW Radar Sensor for Industrial Wideband Applications with Fully-Differential MMIC-to-RWG Interface in SIW", 2021 IEEE/MTT-S International Microwave Symposium, Jun. 7, 2021, pp. 815-818.
Hasan, et al., "F-Band Differential Microstrip Patch Antenna Array and Waveguide to Differential Microstrip Line Transition for FMCW Radar Sensor", IEEE Sensors Journal, vol. 19, No. 15, Aug. 1, 2019, pp. 6486-6496.
Huang, et al., "The Rectangular Waveguide Board Wall Slot Array Antenna Integrated with One Dimensional Subwavelength Periodic Corrugated Grooves and Artificially Soft Surface Structure", Dec. 20, 2008, 10 pages.
Lin, et al., "A THz Waveguide Bandpass Filter Design Using an Artificial Neural Network", Micromachines 13(6), May 2022, 11 pages.
Ogiwara, et al., "2-D MoM Analysis of the Choke Structure for Isolation Improvement between Two Waveguide Slot Array Antennas", Proceedings of Asia-Pacific Microwave Conference 2007, 4 pages.
Razmhosseini, et al., "Parasitic Slot Elements for Bandwidth Enhancement of Slotted Waveguide Antennas", 2019 IEEE 90th Vehicular Technology Conference, Sep. 2019, 5 pages.
Schneider, et al., "A Low-Loss W-Band Frequency-Scanning Antenna for Wideband Multichannel Radar Applications", IEEE Antennas and Wireless Propagation Letters, vol. 18, No. 4, Apr. 2019, pp. 806-810.
Serrano, et al., "Lowpass Filter Design for Space Applications in Waveguide Technology Using Alternative Topologies", Jan. 2013, 117 pages.
Tong, et al., "A Wide Band Transition from Waveguide to Differential Microstrip Lines", Dec. 2008, 5 pages.
Wang, et al., "A 79-GHz LTCC differential microstrip line to laminated waveguide transition using high permittivity material", Dec. 2010, pp. 1593-1596.
Wu, et al., "The Substrate Integrated Circuits—A New Concept for High-Frequency Electronics and Optoelectronics", Dec. 2003, 8 pages.
Yuasa, et al., "A millimeter wave wideband differential line to waveguide transition using short ended slot line", Oct. 2014, pp. 1004-1007.
"Extended European Search Report", EP Application No. 21211165.2, May 13, 2022, 12 pages.
"Extended European Search Report", EP Application No. 21211167.8, May 19, 2022, 10 pages.
"Extended European Search Report", EP Application No. 21211168.6, May 13, 2022, 11 pages.
"Extended European Search Report", EP Application No. 21211452.4, May 16, 2022, 10 pages.
"Extended European Search Report", EP Application No. 21211474.8, Apr. 20, 2022, 14 pages.
"Extended European Search Report", EP Application No. 21211478.9, May 19, 2022, 10 pages.
"Extended European Search Report", EP Application No. 22166998.9, Sep. 9, 2022, 12 pages.
"WR-90 Waveguides", Pasternack Enterprises, Inc., 2016, Retrieved from https://web.archive.org/web/20160308205114/http://www.pasternack.com:80/wr-90-waveguides-category.aspx, 2 pages.
Adams, et al., "Dual Band Frequency Scanned, Height Finder Antenna", 1991 21st European Microwave Conference, 1991, 6 pages.
Alhuwaimel, et al., "Performance Enhancement of a Slotted Waveguide Antenna by Utilizing Parasitic Elements", Sep. 7, 2015, pp. 1303-1306.

Gray, et al., "Carbon Fibre Reinforced Plastic Slotted Waveguide Antenna", Proceedings of Asia-Pacific Microwave Conference 2010, pp. 307-310.
Li, et al., "Millimetre-wave slotted array antenna based on double-layer substrate integrated waveguide", Jun. 1, 2015, pp. 882-888.
Mak, et al., "A Magnetoelectric Dipole Leaky-Wave Antenna for Millimeter-Wave Application", Dec. 12, 2017, pp. 6395-6402.
Mallahzadeh, et al., "A Low Cross-Polarization Slotted Ridged SIW Array Antenna Design With Mutual Coupling Considerations", Jul. 17, 2015, pp. 4324-4333.
Rossello, et al., "Substrate Integrated Waveguide Aperture Coupled Patch Antenna Array for 24 GHz Wireless Backhaul and Radar Applications", Nov. 16, 2014, 2 pages.
Shehab, et al., "Substrate-Integrated-Waveguide Power Dividers", Oct. 15, 2019, pp. 27-38.
Wang, et al., "Low-loss frequency scanning planar array with hybrid feeding structure for low-altitude detection radar", Sep. 13, 2019, pp. 6708-6711.
Wu, et al., "A Planar W-Band Large-Scale High-Gain Substrate-Integrated Waveguide Slot Array", Feb. 3, 2020, pp. 6429-6434.
Xu, et al., "CPW Center-Fed Single-Layer SIW Slot Antenna Array for Automotive Radars", Jun. 12, 2014, pp. 4528-4536.
"Extended European Search Report", EP Application No. 21216319.0, Jun. 10, 2022, 12 pages.
Hausman, "Termination Insensitive Mixers", 2011 IEEE International Conference on Microwaves, Communications, Antennas and Electronic Systems (COMCAS 2011), Nov. 7, 2011, 13 pages.
Yu, et al., "Optimization and Implementation of SIW Slot Array for Both Medium- and Long-Range 77 GHz Automotive Radar Application", IEEE Transactions on Antennas and Propagation, vol. 66, No. 7, Jul. 2018, pp. 3769-3774.
"Extended European Search Report", EP Application No. 23158037.4, Aug. 17, 2023, 9 pages.
"Extended European Search Report", EP Application No. 23158947.4, Aug. 17, 2023, 11 pages.
"Foreign Office Action", CN Application No. 202111550163.3, Jun. 17, 2023, 25 pages.
"Foreign Office Action", CN Application No. 202111550448.7, Jun. 17, 2023, 19 pages.
"Foreign Office Action", CN Application No. 202111551711.4, Jun. 17, 2023, 29 pages.
"Foreign Office Action", CN Application No. 202111551878.0, Jun. 15, 2023, 20 pages.
"Foreign Office Action", CN Application No. 202111563233.9, May 31, 2023, 15 pages.
"Foreign Office Action", CN Application No. 202111652507.1, Jun. 26, 2023, 14 pages.
"Foreign Office Action", CN Application No. 202210251362.2, Jun. 28, 2023, 15 pages.
Ghassemi, et al., "Millimeter-Wave Integrated Pyramidal Horn Antenna Made of Multilayer Printed Circuit Board (PCB) Process", IEEE Transactions on Antennas and Propagation, vol. 60, No. 9, Sep. 2012, pp. 4432-4435.
Hausman, et al., "Termination Insensitive Mixers", 2011 IEEE International Conference on Microwaves, Communications, Antennas and Electronic Systems (COMCAS 2011), Dec. 19, 2011, 13 pages.
"Extended European Search Report", EP Application No. 18153137.7, Jun. 15, 2018, 8 pages.
"Extended European Search Report", EP Application No. 20166797, Sep. 16, 2020, 11 pages.
"Foreign Office Action", CN Application No. 201810122408.4, Jun. 2, 2021, 15 pages.
"Non-Final Office Action", U.S. Appl. No. 16/583,867, filed Feb. 18, 2020, 8 pages.
"Non-Final Office Action", U.S. Appl. No. 15/427,769, filed Nov. 13, 2018, 8 pages.
Notice of Allowance, U.S. Appl. No. 15/427,769, filed Jun. 28, 2019, 9 pages.
"Notice of Allowance", U.S. Appl. No. 16/538,867, filed Jul. 8, 2020, 8 Pages.
Jankovic, et al., "Stepped Bend Substrate Integrated Waveguide to Rectangular Waveguide Transitions", Jun. 2016, 2 pages.

(56) References Cited

OTHER PUBLICATIONS

Second Office Action regarding Chinese Patent Application No. 202111652507.1, dated Sep. 15, 2023. Translation provided by Shanghai Patent & Trademark Law Office, PLLC.

* cited by examiner

FORMED WAVEGUIDE ANTENNAS OF A RADAR ASSEMBLY

CROSS-REFERENCE TO RELATED APPLICATIONS

This application claims the benefit under 35 U.S.C. 119(e) of U.S. Provisional Application No. 63/147,657, filed Feb. 9, 2021, the disclosure of which is hereby incorporated by reference in its entirety herein.

BACKGROUND

Radar systems use electromagnetic signals to detect and track objects. For example, manufacturers can fabricate radar systems using plastic-molded technology with metallic coatings. Manufacturers generally construct such radar systems with several metal-coated plastic layers bonded together. The bonding process can involve an expensive manufacturing technique performed at a relatively high temperature. Plastic materials that can withstand these high temperatures may be too expensive to be used in some radar applications (e.g., automotive radar systems).

SUMMARY

This document describes techniques and systems for formed waveguide antennas of a radar assembly. For example, the radar assembly may include a radar system including a printed circuit board (PCB) and a metal sheet attached to the PCB. The metal sheet can be formed to provide one or more waveguide antennas that each include multiple waveguide channels. Multiple radiation slots can be formed on a surface of each of the multiple waveguide channels. The PCB can also include a monolithic microwave integrated circuit (MMIC) and a thermally conductive material covering a portion of a first and a second surface of the PCB. The metal sheet can also be formed to provide a shield for the MMIC.

This document also describes methods performed by the above-summarized system and other methods set forth herein, as well as means for performing these methods and different configurations of this system.

This Summary introduces simplified concepts for formed waveguide antennas of a radar assembly, which are further described below in the Detailed Description and Drawings. This Summary is not intended to identify essential features of the claimed subject matter, nor is it intended for use in determining the scope of the claimed subject matter.

BRIEF DESCRIPTION OF THE DRAWINGS

The details of one or more aspects of a formed waveguide antenna for a radar assembly are described in this document with reference to the following figures. The same numbers are often used throughout the drawings to reference like features and components.

DETAILED DESCRIPTION

Overview

Figure 1:
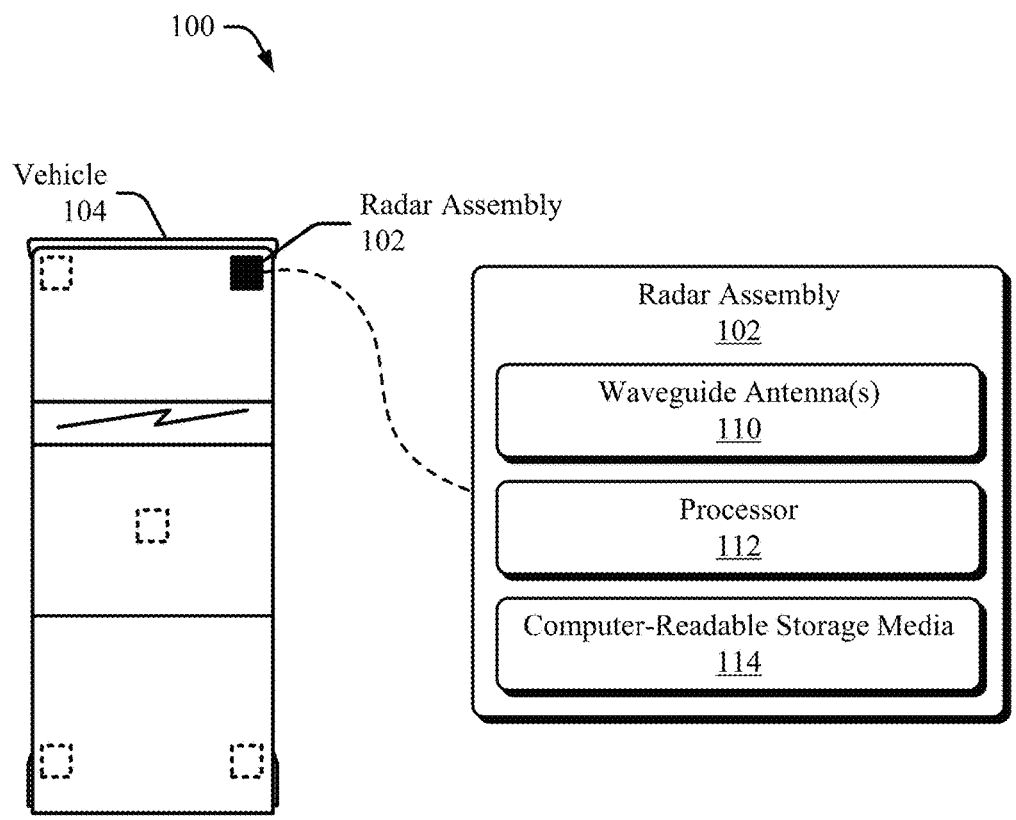
FIG. 1 illustrates an example environment in which formed waveguide antennas of a radar assembly can be implemented.
Figure 1:
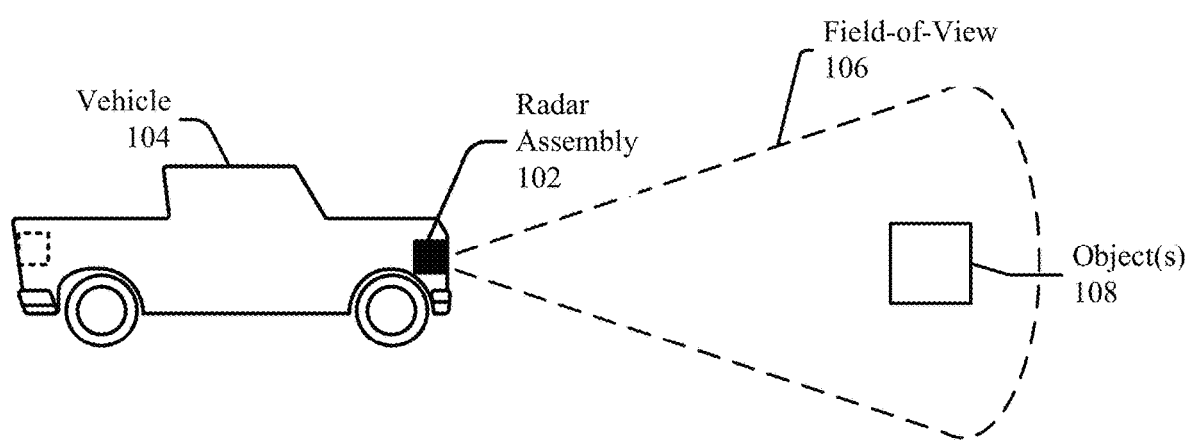

Radar systems are an important sensing technology that some vehicle-based systems rely on to acquire information about the surrounding environment. The antennas for some radar systems are manufactured with materials and manufacturing processes that are relatively expensive and/or introduce performance issues.

Some radar systems use microstrip antennas (e.g., printed antennas, patch antennas) that use photolithographic techniques on a printed circuit board (PCB). Microstrip antennas are relatively inexpensive to manufacture and have a thin planar profile that can be easily integrated into many applications. Microstrip antennas, however, may not provide sufficient performance characteristics for many applications of radar, including automotive radar applications.

To improve the performance characteristics for automotive applications, some manufacturers use injection-molded antennas. Injection-molded antennas can include plastic layers, including a polyetherimide (PEI) layer, with a metal coating (e.g., a silver coating that is applied via physical vapor deposition (PVD)). These plastic layers can be bonded together using solder (e.g., tin-bismuth (Sn—Bi) solder) or other similar techniques. The bonding process, however, is performed at relatively high temperatures (e.g., approximately 165° C.). Plastics that can sustain these higher temperatures are generally more expensive than other materials that cannot tolerate heat as well as the high-temperature plastics.

In contrast, this document describes techniques and systems to minimize cost and improve performance characteristics for antenna waveguides. For example, a radar system can include a printed circuit board (PCB) and a metal sheet attached to the PCB. The metal sheet can be formed to provide one or more waveguide antennas that each include multiple waveguide channels. Multiple radiation slots can be formed on a surface of the multiple waveguide channels. The PCB can include an MMIC and a thermally conductive material covering a portion of a first and a second surface of the PCB. The metal sheet can also be formed to provide a shield for the MMIC. In this way, the described techniques and systems permit the waveguide antennas to be formed with materials and a manufacturing process that reduces costs while still providing high performance (e.g., minimized loss). The described shield can transfer thermal energy produced at least in part by the MIMIC and other discrete components to the periphery of the PCB or to other components of the radar assembly. As a result, the described shield may permit the radar assembly to better distribute thermal energy away from relatively hot components (e.g., the MMIC) and to the rest of the PCB. The described shield may also enable the radar assembly to be manufactured in fewer steps than other radar assemblies that require, for example, the soldering of multiple layers to form the antenna waveguides.

This is just one example of how the described techniques and systems provide formed waveguide antennas of a radar assembly. This document describes other examples and configurations.

Operating Environment

FIG. 1 illustrates an example environment 100 in which formed waveguide antennas 110 of a radar assembly 102 can be implemented. In the depicted environment 100, the radar assembly 102 is mounted to, or integrated within, a vehicle 104. The radar assembly 102 can detect one or more objects 108 that are near the vehicle 104. Although illustrated as a car or automobile, the vehicle 104 can represent other types of motorized vehicles (e.g., an automobile, a motorcycle, a bus, a tractor, a semi-trailer truck, or construction equipment), non-motorized vehicles (e.g., a bicycle), railed vehicles (e.g., a train or a trolley car), watercraft (e.g., a boat or a ship), aircraft (e.g., an airplane or a helicopter), or spacecraft (e.g., satellite). In general, manufacturers can mount the radar assembly 102 to any moving platform, including moving machinery or robotic equipment, to detect the one or more objects 108.

In the depicted implementation, the radar assembly 102 is mounted on the front of the vehicle 104 and provides a field-of-view 106 illuminating the one or more objects 108. The radar assembly 102 can project the instrumental field-of-view 106 from or through any exterior surface of the vehicle 104. For example, vehicle manufacturers can integrate the radar assembly 102 into a bumper, side mirror, headlights, rear lights, or any other interior or exterior location where the object 108 requires detection. In some cases, the vehicle 104 includes multiple radar assemblies 102, such as a first radar assembly 102 and a second radar assembly 102 that together provide a larger field-of-view 106. In general, vehicle manufacturers can design the locations of the radar assemblies 102 to provide a particular field-of-view 106 that encompasses a region of interest in which the object 108 may be present. Example fields-of-view 106 include a 360-degree field-of-view, one or more 180-degree fields-of-view, one or more 90-degree field-of-view, and so forth, which can overlap or be combined into a field-of-view 106 of a particular size.

The object 108 is composed of one or more materials that reflect radar signals or electromagnetic (EM) signals. Depending on the application, the object 108 can represent a target of interest. In some cases, the object 108 can be a moving object or a stationary object. The stationary objects can be continuous (e.g., a concrete barrier, a guard rail) or discontinuous (e.g., a traffic cone) along a road portion.

The radar assembly 102 emits electromagnetic radiation by transmitting one or more electromagnetic signals or waveforms via active elements. In the environment 100, the radar assembly 102 can detect and track the object 108 by transmitting and receiving one or more radar signals. As an example, the radar assembly 102 can transmit electromagnetic signals between 100 and 400 gigahertz (GHz), between 4 and 100 GHz, or between approximately 70 and 80 GHz.

The radar assembly 102 can determine a distance to the object 108 based on a time it takes for the EM signals to travel from the radar assembly 102 to the object 108 and from the object 108 back to the radar assembly 102. The radar assembly 102 can also determine, based on the direction of a maximum amplitude echo signal received, the location of the object 108 in terms of an angle.

The radar assembly 102 can be part or integrated as part of the vehicle 104. The vehicle 104 can also include at least one automotive system that relies on data from the radar assembly 102, including a driver-assistance system, an autonomous-driving system, or a semi-autonomous-driving system. The radar assembly 102 can include an interface to the automotive system, wherein the formed waveguide antenna 110 can output, via the interface, a signal based on electromagnetic energy received by the formed waveguide antenna 110. Generally, the automotive systems use radar data provided by the radar assembly 102 to perform a function. For example, the driver-assistance system can provide blind-spot monitoring and generate an alert indicating a potential collision with the object 108 detected by the radar assembly 102. In this case, the radar data from the radar assembly 102 indicates when it is safe or unsafe to change lanes.

The autonomous-driving system may move the vehicle 104 to a particular location on the road while avoiding collisions with detected objects 108. The radar data provided by the radar assembly 102 can provide information about a distance to and the location of the object 108 to enable the autonomous-driving system to perform emergency braking, perform a lane change, or adjust the speed of the vehicle 104.

The radar assembly 102 includes a transmitter (not illustrated in FIG. 1) to transmit electromagnetic signals and a receiver (not illustrated in FIG. 1) to receive reflected versions of these electromagnetic signals. The transmitter includes components for emitting electromagnetic signals, including the formed waveguide antenna 110. The receiver includes one or more components to detect the reflected electromagnetic signals, including the formed waveguide antenna 110. Also sometimes referred to as a transceiver, the transmitter and the receiver can be separated or combined and may be incorporated together on the same integrated circuit (e.g., a transceiver integrated circuit) or, when separated, may be incorporated separately on different integrated circuits. The radar assembly 102 can also include other components and integrated circuits (e.g., an MIMIC) to perform mixing, power amplification, low-noise amplification, high-frequency switching, and other functions on the transmitted and/or received electromagnetic signals.

The radar assembly 102 also includes one or more processors 112 and computer-readable storage media (CRM) 114. The processor 112 can be a microprocessor or a system-on-chip. The processor 112 executes instructions stored within the CRM 114. For example, the processor 112 can process electromagnetic energy received by the formed waveguide antenna 110 and locate the object 108 relative to the radar assembly 102. The processor 112 can also generate radar data for automotive systems. As another example, the processor 112 can control, based on processed electromagnetic energy from the formed waveguide antenna 110, an autonomous or semi-autonomous driving system of the vehicle 104.

The described radar assembly 102 can minimize cost and improve performance characteristics for the waveguide antennas 110. As described in greater detail with respect to FIGS. 2 through 5F, the waveguide antennas 110 can be formed out of one or more metal sheets with multiple waveguide channels. In this way, the waveguide antennas 110 can be formed with materials and a manufacturing process that reduces costs while still providing high performance (e.g., minimized loss). The metal sheet can also be further configured to form a shield around the processor 112 or other discrete components of the radar assembly 102. The described shield can transfer thermal energy produced at least in part by the processor 112 and other discrete components to the periphery of a PCB or to other components of the radar assembly 102. As a result, the described shield may permit the radar assembly 102 to better distribute thermal energy away from relatively hot components (e.g., the processor 112) and to the rest of the PCB. The described shield may also enable the radar assembly 102 to be manufactured in fewer steps than other radar assemblies that require, for example, the soldering of multiple layers to form the antenna waveguides.

Figure 2:
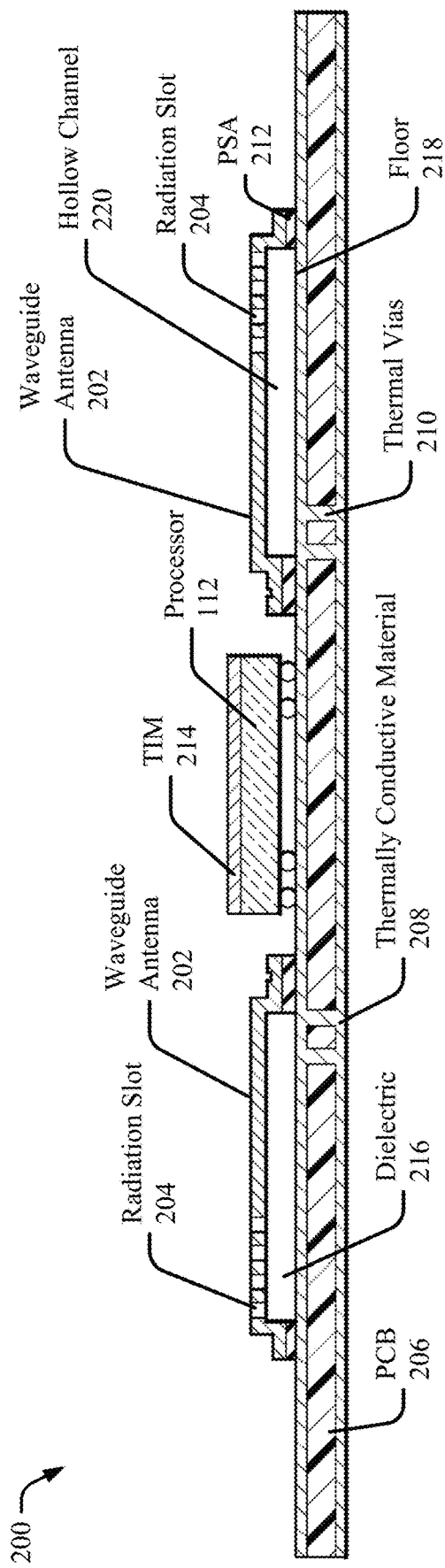
FIGS. 2-4 illustrate cross-sections of example radar assemblies with formed waveguide antennas.

FIG. 2 illustrates a cross-section of an example radar assembly 200 with formed waveguide antennas 202. The radar assembly 200 includes multiple waveguide antennas 202, a PCB 206, a processor 112, and a termination insensitive mixer (TIM) 214. The multiple waveguide antennas 202 can, for example, include or be part of a transmitter and receiver for the radar assembly 200. The transmitter, coupled with a waveguide antenna 202, can transmit electromagnetic signals. The receiver, coupled with another waveguide antenna 202, can receive reflected versions of the transmitted electromagnetic signals.

The PCB 206 is a circuit board, or other substrate, to which the waveguide antennas 202, the processor 112, and the CRM 114 can be attached. The PCB 206 can be a standard circuit board of flat laminated composite made from non-conductive substrate materials with one or more layers of copper circuitry. Other examples of the PCB 206 exist; the PCB 206 provides at least one surface for attaching the waveguide antennas 202.

The PCB 206 can include multiple thermal vias 210 between the surfaces of the PCB 206. A thermally conductive material 208 (e.g., copper circuit traces) covers at least a portion of the surfaces of the PCB 206 and the inner surface(s) of the thermal vias 210. The thermally conductive material 208 can also cover the distal ends of the thermal vias 210, as illustrated in FIG. 2. The thermally conductive material 208 can be metal, including, for example, a copper alloy, and cover unpopulated areas of the surfaces of the PCB 206.

The processor 112 can, for example, be an integrated circuit (IC), MMIC, or microprocessor. The processor 112 can operably connect via a ball grid array (BGA) to a surface of PCB 206 or another circuit board, which operably connects via another BGA to a surface of the PCB 206. As illustrated in FIG. 2, the thermally conductive material 208 covers the surface of the PCB 206 under the processor 112. In another implementation, the thermally conductive material 208 does not cover the surface of the PCB 206 under the processor 112 to avoid interfering with the connection between the processor 112 and the PCB 206. The TIM 214 is a microwave mixer that is a non-linear device used to translate one segment of the frequency spectrum of EM signals to another portion of the frequency spectrum without distorting the EM signals. In some implementations, the TIM 214 can be configured to provide cancellation of reflected EM signals as well as maintain the harmonics rejection, spurious component rejection, and port-to-port isolation characteristic of a double-balanced configuration. The TIM 214 can be collocated with the processor 112 (or a MIMIC) to improve signal processing of the reflected EM signals and reduce reduction of additional noise into the reflected EM signals.

The waveguide antennas 202 are formed from one or more metal sheets. The metal sheets are sheet formed into one or more waveguide channels. The metal sheets can be made of an aluminum alloy, stainless steel, a copper alloy, or other metal alloys. The waveguide channels can be formed using a die, hydroforming techniques, or some other process. The waveguide antennas 202 are mounted to the PCB 206 using a conductive or non-conductive pressure-sensitive adhesive (PSA) 212. In other implementations, the waveguide antennas 202 can be soldered or otherwise attached to the PCB 206.

The waveguide antennas 202 are electrically coupled to a dielectric 216 via a floor 218 of the waveguide channels. Electromagnetic signals enter the waveguide channels through an opening in the waveguide channels and exit the waveguide channels via the radiation slots 204. The waveguide channels of the waveguide antennas 202 provide a hollow channel 220 for the dielectric 216. The dielectric 216 generally includes air, and the waveguide antennas 202 are air waveguide antennas.

The waveguide channels can form an approximately rectangular shape or a zigzag shape along a longitudinal direction. The cross-section of the waveguide channels can form an approximately rectangular shape. In other implementations, the cross-section of the waveguide channels can form an approximately square, oval, trapezoidal, or circular opening.

The waveguide channels include multiple radiation slots 204. The radiation slots 204 can be bored, cut, etched, or punched through a top surface of the waveguide channels in accordance with predetermined patterns or configurations. The radiation slots 204 provide an opening through the metal sheet that defines a surface of the waveguide channels. The radiation slots 204 can have an approximately rectangular shape (e.g., a longitudinal slot parallel to a longitudinal direction of the waveguide channels). The radiation slots 204 can have other shapes, including approximately circular, oval, or square.

The radiation slots 204 can be sized and positioned on the waveguide channels to produce a particular radiation pattern for the waveguide antennas 202. For example, at least some of the radiation slots 204 can be offset from a centerline of the waveguide channels by varying or non-uniform distances (e.g., in a zigzag shape) to reduce or eliminate side lobes from the radiation pattern of the waveguide antennas 202. As another example, the radiation slots 204 nearer the closed end of the waveguide channels can have a larger longitudinal opening than the radiation slots 204 nearer the opening of the waveguide channels. The specific size and position of the radiation slots 204 can be determined by building and optimizing a model of the waveguide antennas 202 to produce the desired radiation pattern.

Figure 3:
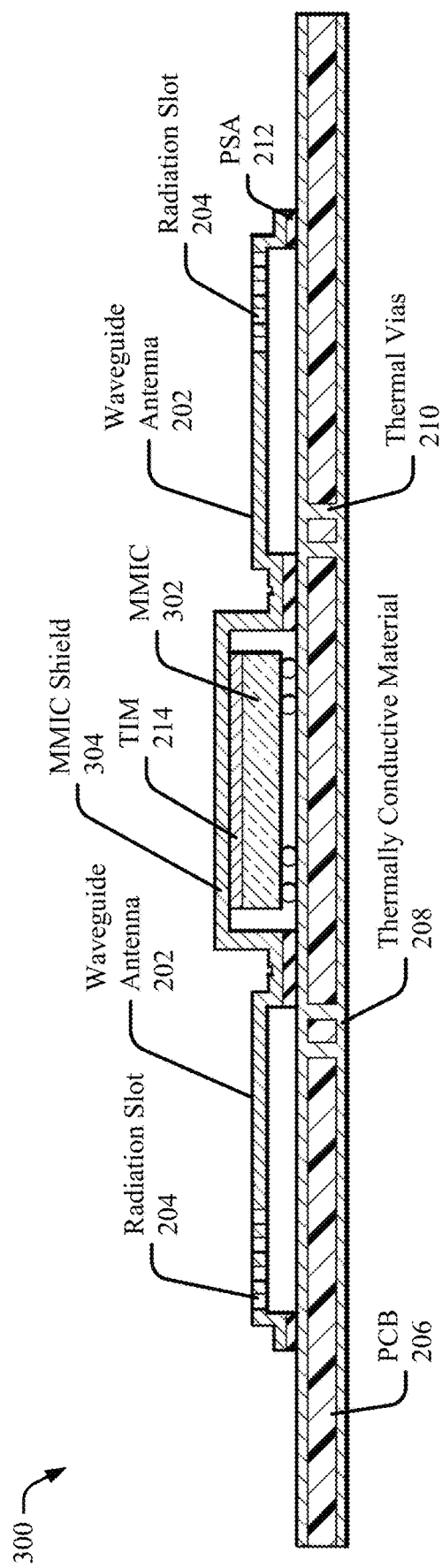

FIG. 3 illustrates a cross-section of another example radar assembly 300 with formed waveguide antennas 202. The radar assembly 300 is similar to the radar assembly 200 of FIG. 2. Like the radar assembly 200 of FIG. 2, the radar assembly 300 includes the multiple waveguide antennas 202, the PCB 206, an MMIC 302 (in lieu of the processor 112), and the TIM 214. The discrete components of the radar assembly 300 can be provided in other arrangements on one or more surfaces of the PCB 206.

Similar to FIG. 2, the waveguide antennas 202 are formed from one or more metal sheets. The metal sheets are sheet formed to form multiple waveguide channels. The metal sheets can be made of an aluminum alloy, stainless steel, or a copper alloy. The waveguide channels can be formed using a die, hydroforming techniques, or some other process. The metal sheet is also used to form an MMIC shield 304 for the MMIC 302 and the TIM 214.

The MMIC shield 304 can distribute thermal energy produced by the MMIC 302 and the TIM 214 away from the components and to a housing (not illustrated in FIG. 3) via the thermally conductive material 208 and the thermal vias 210. The MMIC shield 304 can extend to unpopulated areas of the PCB 206 and thermally connects via the thermally conductive material 208 to a ground plane of the PCB 206. The MMIC shield 304 can also prevent or suppress electromagnetic signals or radiation interfering with operations of the MMIC 302 and the TIM 214.

In this way, the MMIC shield 304 enables the radar assembly 300 to have improved performance at times, when compared with the radar assembly 200. In a noisy environment where electromagnetic signals or interference from another radar or other systems is present in and around the vehicle 104.

Figure 4:
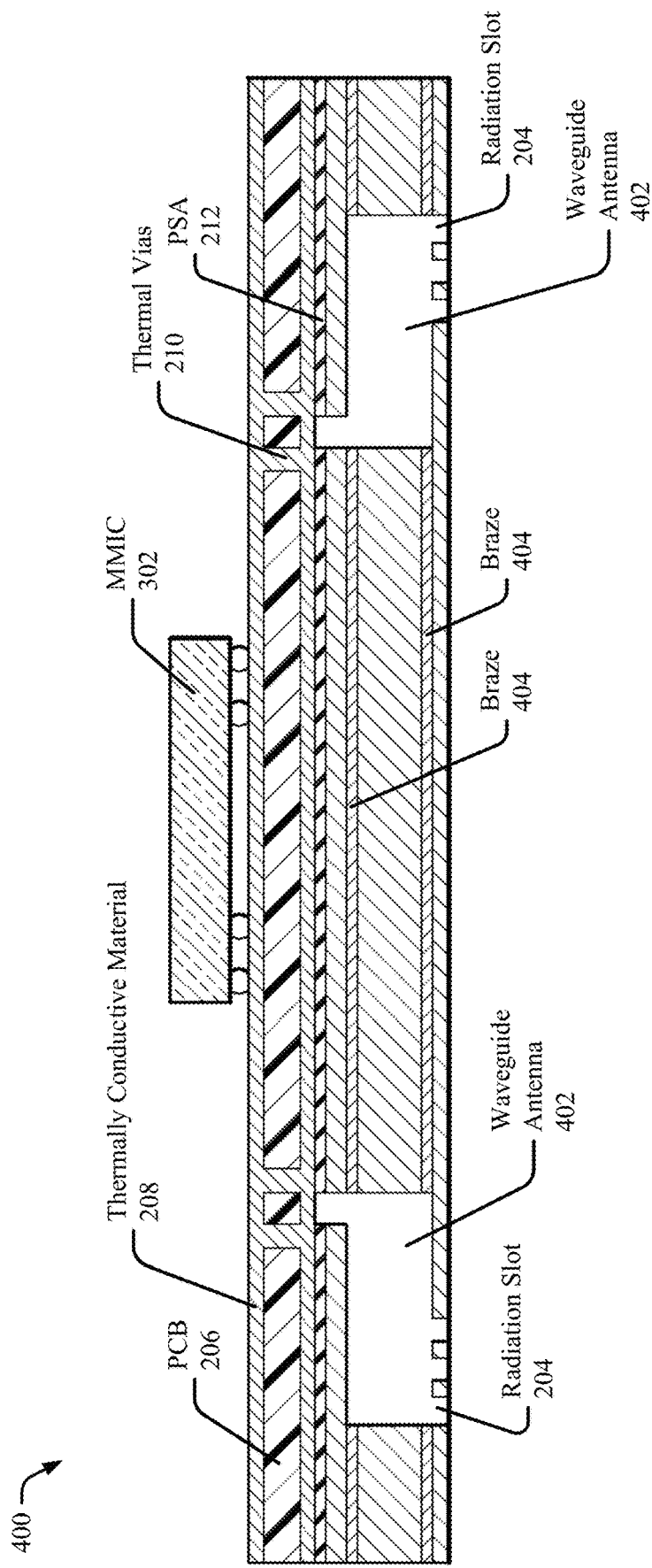

FIG. 4 illustrates a cross-section of another example radar assembly 400 with formed waveguide antennas 402. The radar assembly 400 is similar to the radar assembly 200 of FIG. 2 and the radar assembly 300 of FIG. 3. Like the radar assembly 200 and the radar assembly 300, the radar assembly 400 includes the multiple waveguide antennas 402, the PCB 206, and the MIMIC 302. The discrete components of the radar assembly 400 can be provided in other arrangements on one or more surfaces of the PCB 206.

In this implementation, the waveguide antennas 402 are attached or connected to a different surface of the PCB 206 than the MIMIC 302. In other implementations, the MIMIC 302 and the waveguide antennas can connect or be attached to the same surface of the PCB 206.

The waveguide antennas 402 are formed from multiple metal sheets. The metal sheets can be an aluminum alloy, stainless steel, a copper alloy, or other metal alloy. The metal sheets are connected together via a braze 404. For example, the metal sheets can be brazed together using aluminum braze or another brazing material. In other implementations, the metal sheets can be connected together using shear forming, a stake-and-rollover process, spot welding, and/or lamination cladding.

The waveguide channels 402 and radiation slots 204 can be formed by stamping or otherwise removing portions of the metal sheets. The waveguide antennas 402 are mounted to the PCB 206 using a conductive or non-conductive PSA 212. In other implementations, the waveguide antennas 402 can be soldered or otherwise attached to the PCB 206. As described above, the waveguide channels and radiation slots can be sized and arranged to generate a desired radiation pattern.

Use of the radar system 200, 300, or 400 can depend on the application. For example, where a particular form factor is desired, the radar system 400 may provide the most flexibility in designing a layout for the PCB 206. The radar systems 200 and 300 may provide a cheaper or more expensive solution, depending on a desired accuracy in the radar data, for example.

FIGS. 5A-5D illustrate several views and layers of an example formed waveguide antenna. As described with respect to FIG. 4, the waveguide antenna can be formed from several metal sheets. FIGS. 5E and 5F illustrate a cross-section view 502 and a three-dimensional (3D) perspective view 512 of the layers of the formed waveguide antenna.

Figure 5A:
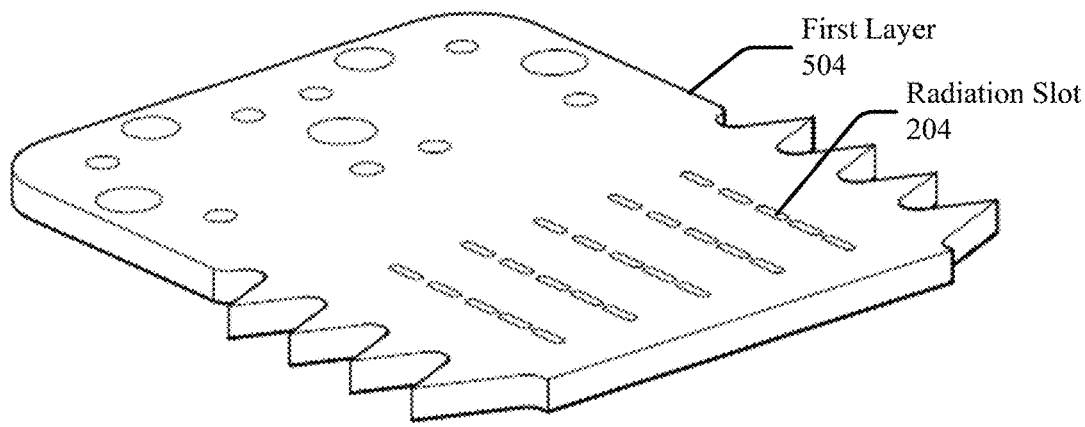
FIGS. 5A-5F illustrate several views and layers of an example formed waveguide antenna.
Figure 5B:
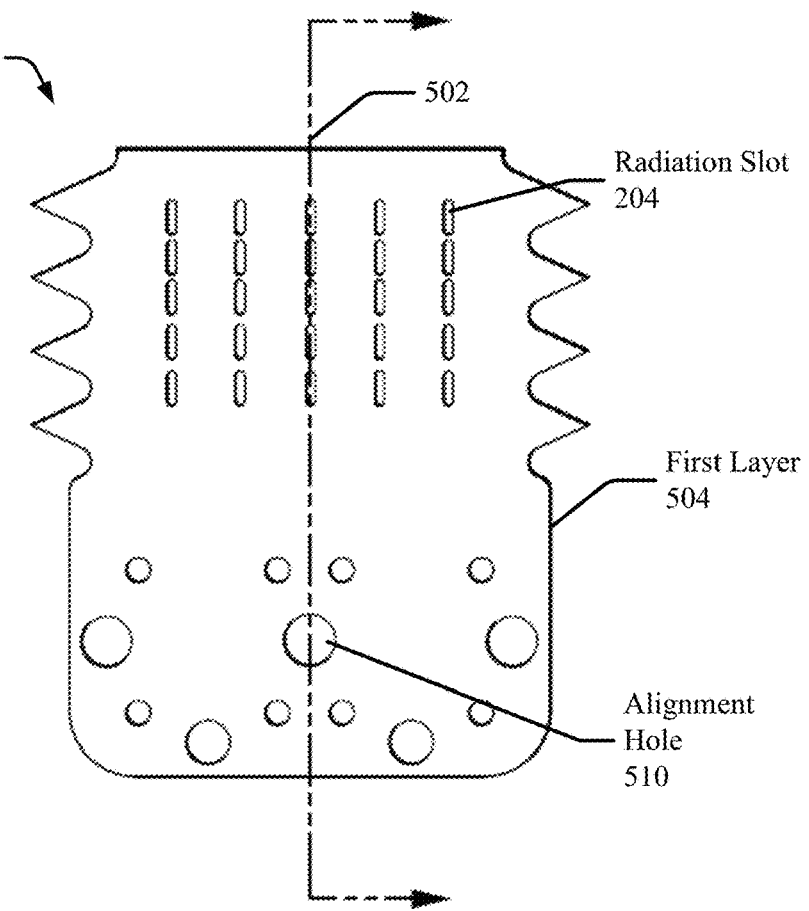

FIGS. 5A and 5B illustrate a perspective view 500-1 and a top view 500-2 of a first layer 504 of the formed waveguide antenna. As described with respect to FIGS. 2-4, the first layer 504 includes the radiation slots 204. The radiation slots 204 are sized and positioned on or in the first layer 504 to produce a particular radiation pattern. For example, the plurality of radiation slots 204 can be evenly distributed along the waveguide channels to suppress grating lobes in the radiation pattern. The first layer 504 also includes several alignment holes 510 that can be used to align the metal sheets during the brazing or other connection procedure.

Figure 5C:
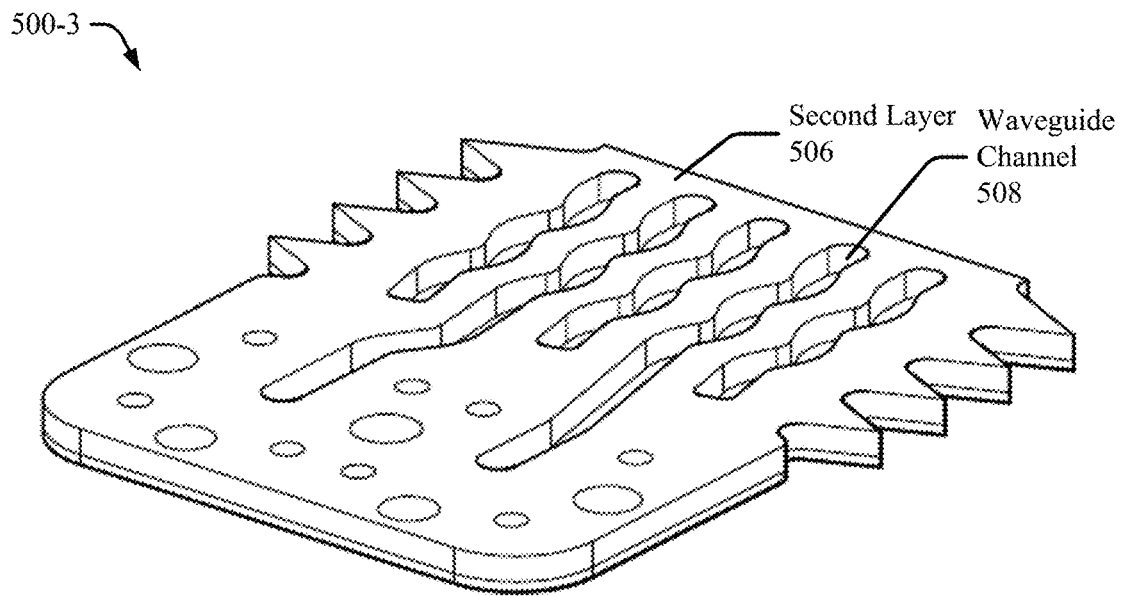
Figure 5D:
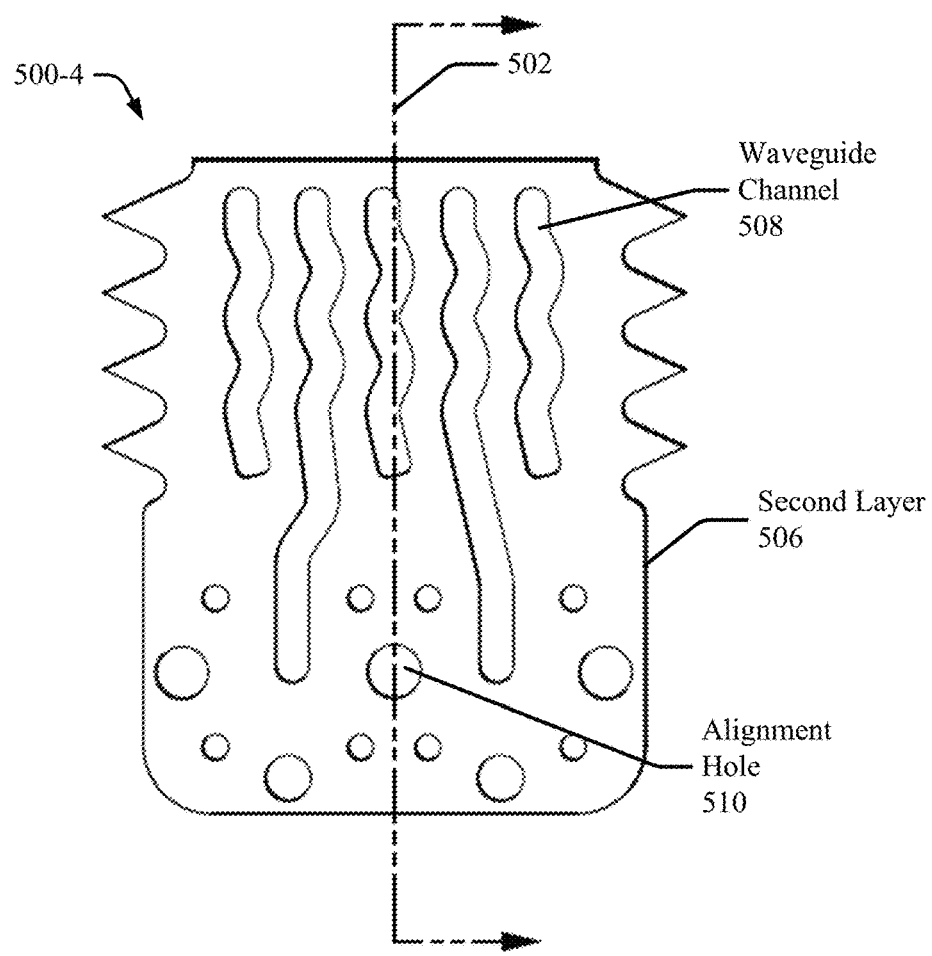
Figure 5E:
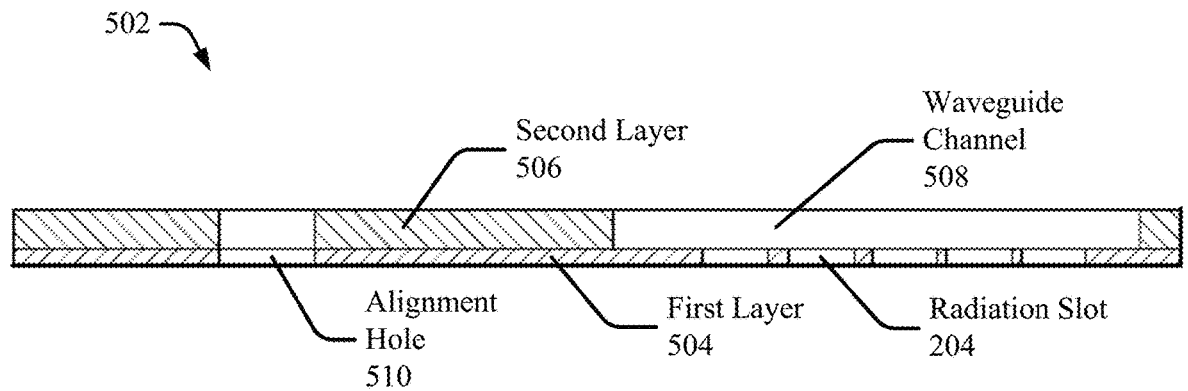
Figure 5F:
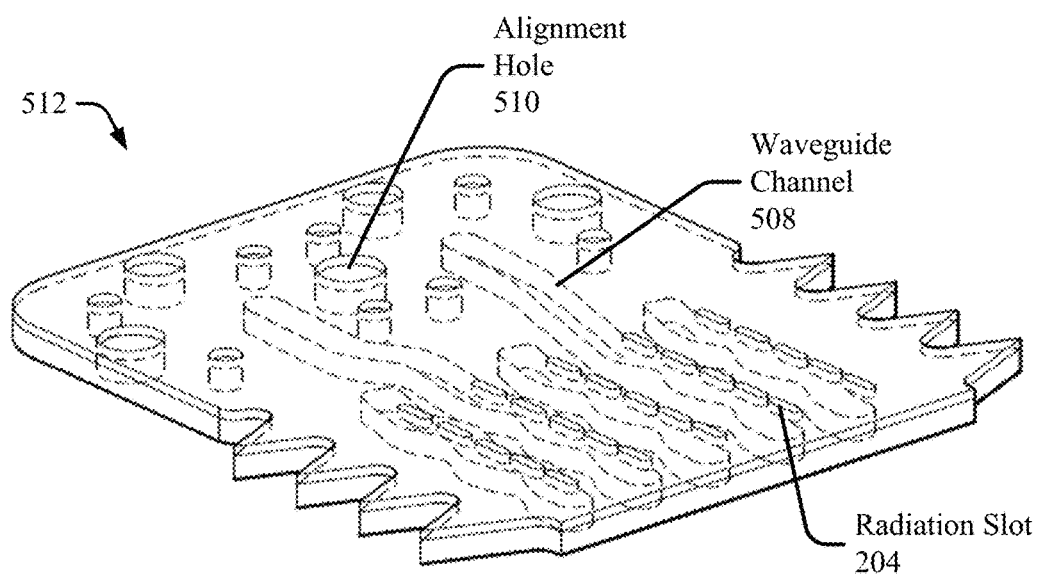

FIGS. 5C and 5D illustrate a perspective view 500-3 and a top view 500-4 of a second layer 506 of the formed waveguide antenna. As described with respect to FIGS. 2-4, the second layer 506 includes waveguide channels 508. The second layer 506 also includes the alignment holes 510 to align the first layer 504 and the second layer 506 during the brazing or other connection procedure. As illustrated in FIGS. 5C and 5D, the waveguide channels 508 have a zigzag shape along a longitudinal direction of the waveguide channels. The zigzag shape of the waveguide channels 508 can reduce or eliminate grating lobes in the radiation pattern that a straight or rectangular waveguide channel shape can introduce. The turns in the zigzag shape can include various turning angles to provide the zigzag shape. The zigzag shape of the waveguide channels 508 allows the radiation slots 204 to be positioned in an approximately straight line along the longitudinal direction of the waveguide channels.

FIG. 5E illustrates the cross-section view 502 of the formed waveguide channel. As illustrated in FIG. 5E, the alignment holes 510 of the first layer 504 and the second layer 506 are aligned during the connection process. The radiation slots 204 of the first layer 504 are positioned over (or under) the waveguide channels 508 of the second layer 506.

FIG. 5F illustrates the 3D perspective view 512 of the formed waveguide channel. As illustrated in FIG. 5F, the alignment holes 510 of the first layer 504 and the second layer 506 are aligned during the connection process. The radiation slots 204 of the first layer 504 are positioned over (or under) the waveguide channels 508 of the second layer 506; thus, the radiation slots 204 are connected to the dielectric 216 (e.g., air) contained with the hollow channel 220 of the waveguide channels 508.

Figure 6A:
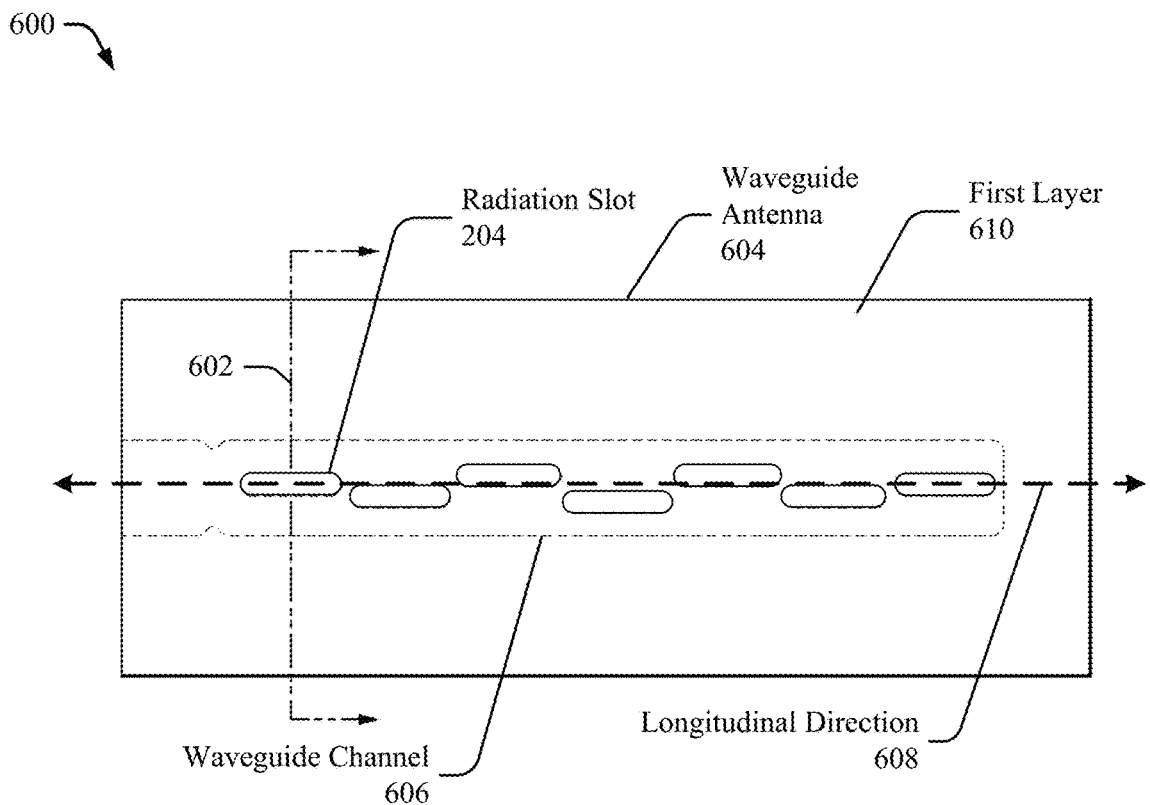
FIGS. 6A and 6B illustrate several views and layers of another example formed waveguide antenna.
Figure 6B:
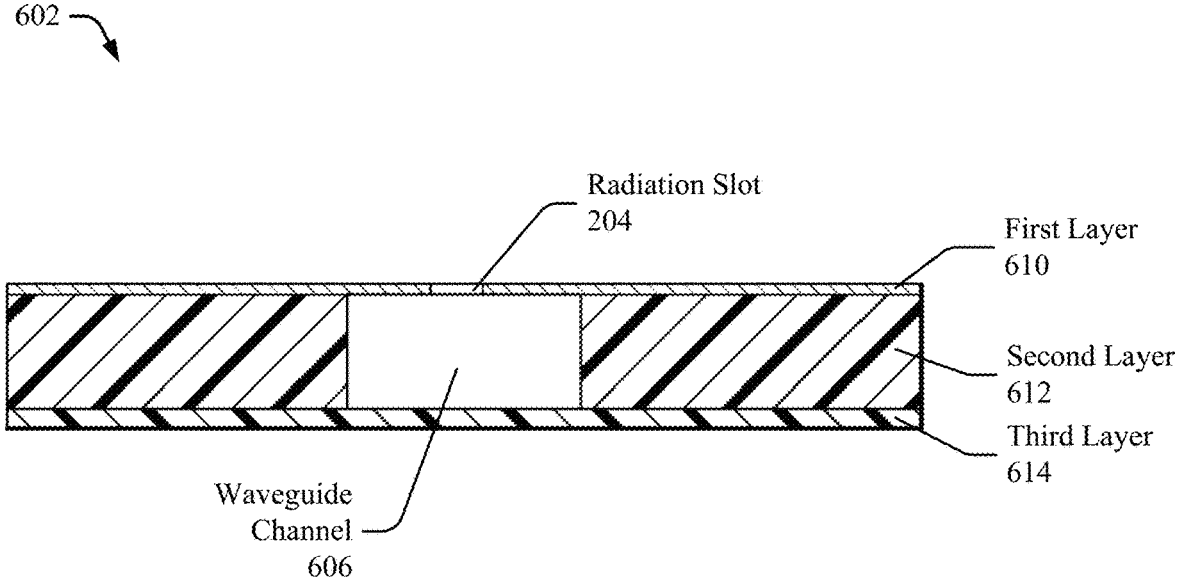

FIG. 6A illustrates a top view 600 of another example formed waveguide antenna 604. FIG. 6B illustrates a cross-section view 602 of the formed waveguide antenna 604. The waveguide antenna 604 includes a waveguide channel 606 and the radiation slots 204.

The waveguide 604 includes a first layer 610, a second layer 612, and a third layer 614. The first layer 610 and the second layer 612 can be formed from metal sheets, as described above with respect to FIGS. 5A through 5F. The third layer 614 can be the thermally-conductive material 208 or the PCB 206. The second layer 612 and the third layer 614 form sides and the floor, respectively, of the waveguide channel 606. The first layer 610 and the second layer 612 are separate layers in the depicted implementation. In other implementations, the first layer 610 and the second layer 612 can be formed as a single layer and combined with the PCB structure to form the waveguide channel 606.

The use of the PCB structure allows manufacturing of the waveguide antenna 604 to be cheaper, less complicated, and easier for mass production. As another example, using a PCB provides low loss of EM radiation from the input of the waveguide channel 606 to radiation from the radiation slots 204.

The waveguide channel 606 can include a hollow channel for a dielectric. The dielectric generally includes air, and the waveguide antenna 604 is an air waveguide. The waveguide channel 606 forms an opening in a longitudinal direction 608 at one end of the waveguide antenna 604 and a closed wall at an opposite end. In the depicted implementation, the waveguide antenna 604 includes a single waveguide channel 606, but the waveguide antenna 604 can include multiple waveguide channels 606 in other implementations. EM signals enter the waveguide channel 606 through the opening and exit the waveguide channel 606 via the radiation slots 204. In FIG. 6A, the waveguide channel 606 forms an approximately rectangular shape in the longitudinal direction 608. The waveguide channel 606 can also form a zigzag shape in the longitudinal direction 608.

As depicted in FIG. 6B, the waveguide channel 606 can form an approximately rectangular opening in the cross-section view 602 of the waveguide antenna 604. In other implementations, the waveguide channel 606 can form an approximately square, oval, or circular opening in the cross-section view 602 of the waveguide antenna 604. In other words, the opening to the waveguide channel 606 can have an approximately square shape, oval shape, or circular shape.

The radiation slots 204 are sized and positioned on the first layer 610 to produce a particular radiation pattern for the antenna. For example, at least some of the radiation slots 204 are offset from the longitudinal direction 608 (e.g., a centerline of the waveguide channel 606) by varying or non-uniform distances (e.g., in a zigzag shape) to reduce or eliminate side lobes from the radiation pattern of the waveguide antenna 604. As another example, the radiation slots 204 nearer the wall at the opposite end of the waveguide channel 606 can have a larger longitudinal opening than the radiation slots 204 nearer the opening of the waveguide channel 606. The specific size and position of the radiation slots 204 can be determined by building and optimizing a model of the waveguide antenna 604 to produce the desired radiation pattern.

The plurality of radiation slots 204 is evenly distributed along the waveguide channel 606 between the opening of the waveguide channel and the closed wall. Each adjacent pair of radiation slots 204 are separated along the longitudinal direction 608 by a uniform distance to produce a particular radiation pattern. The uniform distance, which is generally less than one wavelength of the EM radiation, can prevent grating lobes in the radiation pattern.

EXAMPLE METHOD

Figure 7:
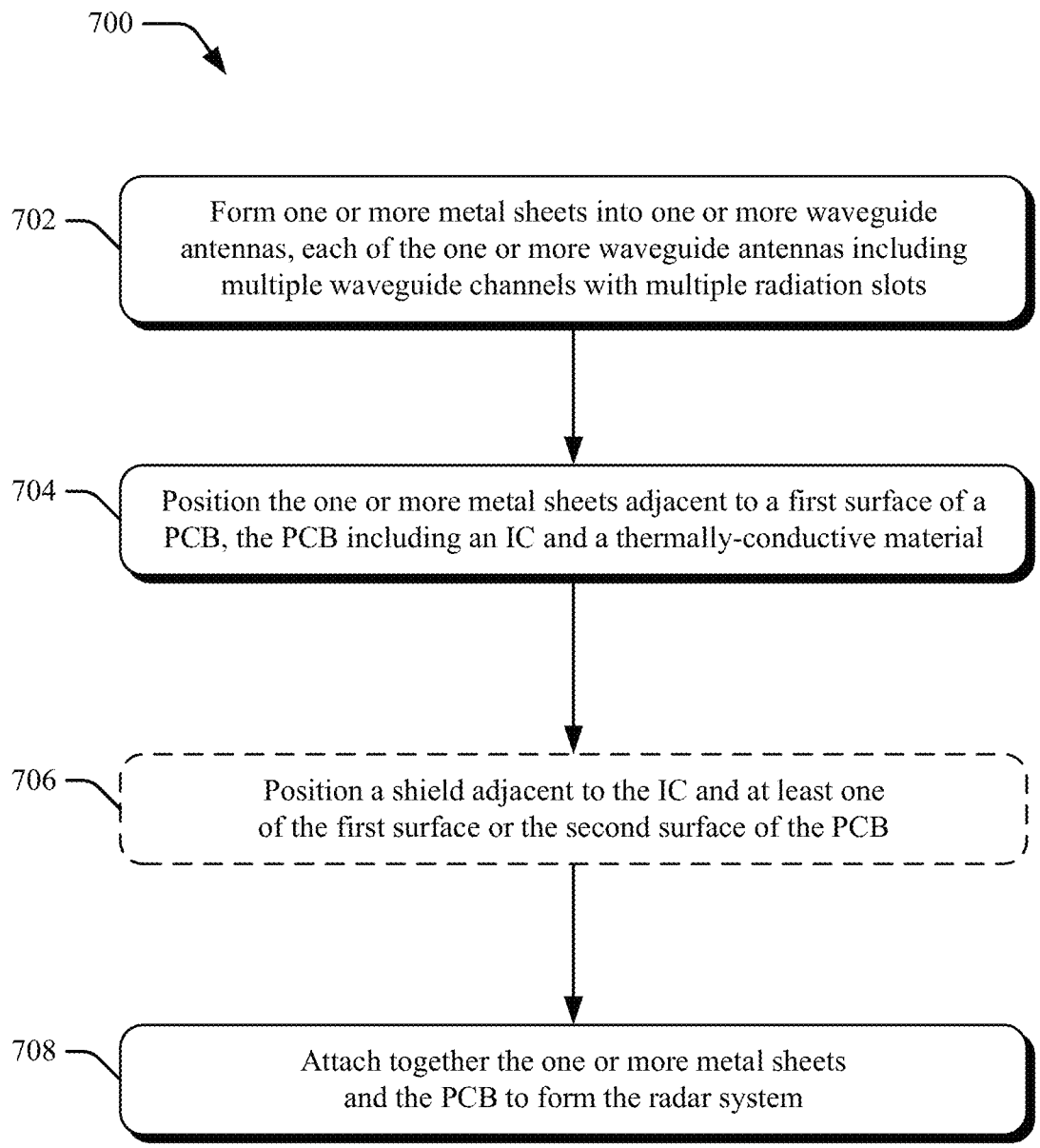
FIG. 7 depicts an example method of assembling a radar system with formed waveguide antennas.

FIG. 7 depicts an example method 700 of assembling a radar assembly 102 with formed waveguide antennas 110. Method 700 is shown as sets of operations (or acts) performed, but not necessarily limited to the order or combination in which the operations are shown herein. Further, any of one or more of the operations may be repeated, combined, or reorganized to provide other methods. In portions of the following discussion, reference may be made to the radar assembly 102 of FIG. 1 or the radar assemblies of FIGS. 2 through 6B, respectively, and entities detailed therein, reference to which is made for example only. The techniques are not limited to performance by one entity or multiple entities.

At 702, one or more metal sheets are formed into one or more waveguide antennas. Each of the one or more waveguide antennas includes multiple waveguide channels with multiple radiation slots. The multiple radiation slots are arranged in a surface of each of the multiple waveguide channels through to the multiple waveguide channels. For example, the radar assembly 200 includes a single metal sheet formed into two waveguide antennas 202. Each waveguide antenna 202 includes multiple waveguide channels with multiple radiation slots 204. The radiation slots 204 are arranged in a surface of the multiple waveguide channels and through to the hollow channel 220 of the waveguide channels to generate a desired radiation pattern. As another example, the radar assembly 400 includes three metal sheets formed into two waveguide antennas 404. The waveguide antennas 404 include multiple waveguide channels with multiple radiation slots 204. The metal sheets can be brazed together to form the waveguide antennas 404.

At 704, the one or more metal sheets are positioned adjacent to a first surface of a PCB. The PCB includes an IC and a thermally conductive material that covers at least a portion of the first surface and a second surface of the PCB. The second surface of the PCB is opposite the first surface of the PCB. For example, the radar assembly 200 includes the one or more metal sheets positioned adjacent to a first surface of the PCB 206. The PCB 206 includes the processor 112 and the thermally conductive material 208, which covers at least a portion of the first surface and the second surface of the PCB 206. The second surface of the PCB 206 is opposite the first surface of the PCB 206. In other implementations, the PCB 206 can also include an MMIC 302 and/or a TIM 214. As another example, the radar assembly 400 includes the three metal sheets positioned adjacent to a first surface of the PCB 206. The PCB 206 includes the MMIC 302 attached to the second surface of the PCB 206.

At 706, a shield is optionally positioned adjacent to the IC and at least one of the first surface or the second surface of the PCB. The shield is configured to distribute thermal energy produced by the IC away from the IC. For example, the radar assembly 300 also includes the MMIC shield 304 positioned adjacent to the MMIC 302 and the TIM 214 and the first surface of the PCB 206. The shield 304 is configured to distribute thermal energy produced by the MMIC 302 and/or the TIM 214 away from the MMIC 302.

At 708, the one or more metal sheets and the PCB are attached together to form the radar system. For example, the metal sheet of the waveguide antennas 202 and the PCB 206 are attached, including using PSA 212, to form the radar assembly 200. As another example, the three metal sheets for the waveguide antennas 402 and the PCB 206 are attached, including using PSA 212, to form the radar assembly 400.

EXAMPLES

In the following section, examples are provided.

Example 1: A radar assembly comprising: a printed circuit board (PCB) having a first surface and a second surface; and one or more metal sheets attached to the first surface or the second surface of the PCB, the metal sheets configured into one or more waveguide antennas, each of the one or more waveguide antennas including multiple waveguide channels with multiple radiation slots, the multiple radiation slots being arranged in a surface of each of the metal sheets through to the multiple waveguide channels.

Example 2: The radar assembly of example 1, wherein the PCB includes an integrated circuit (IC) and a thermally conductive material that covers at least a portion of the first surface of the PCB and at least a portion of the second surface of the PCB opposite the first surface of the PCB.

Example 3: The radar assembly of example 2, wherein: the one or more metal sheets comprise a single metal sheet; and the single metal sheet is further configured into a shield, the shield being adjacent to the IC and configured to distribute thermal energy produced at least in part by the IC away from the IC.

Example 4: The radar assembly of example 3, the radar assembly further comprising a termination insensitive mixer attached to the IC, wherein the shield is adjacent to the IC and the termination insensitive mixer.

Example 5: The radar assembly of example 2, wherein: the IC is a monolithic microwave integrated circuit (MMIC) and is positioned on the first surface of the PCB; the PCB further includes multiple thermal vias between the first surface of the PCB and the second surface of the PCB, the multiple thermal vias configured to distribute thermal energy produced at least in part by the MIMIC from the first surface of the PCB to the second surface of the PCB; and the thermally conductive material covers an inner surface of the thermal vias.

Example 6: The radar assembly of example 5, wherein the thermally conductive material also covers a first distal end and a second distal end of the thermal vias to distribute the thermal energy produced at least in part by the MMIC along the first surface of the PCB.

Example 7: The radar assembly of example 5, wherein a first distal end and a second distal end of the thermal vias are not covered by the thermally conductive material.

Example 8: The radar assembly of example 2, wherein the thermally conductive material comprises circuit traces formed of metal.

Example 9: The radar assembly of example 2, wherein the thermally conductive material and the one or more metal sheets include at least one of an aluminum alloy, stainless steel, or a copper alloy.

Example 10: The radar assembly of example 1, wherein the one or more metal sheets comprise multiple layers.

Example 11: The radar assembly of example 10, wherein the multiple layers of the one or more metal sheets are connected together by brazing.

Example 12: The radar assembly of example 1, wherein the radar assembly is configured to be installed on an automobile to detect objects in an environment of the automobile.

Example 13: A method of assembling a radar system, the method comprising: forming one or more metal sheets into one or more waveguide antennas, each of the one or more waveguide antennas including multiple waveguide channels with multiple radiation slots, the multiple radiation slots being arranged in a surface of each of the multiple waveguide channels through to the multiple waveguide channels; positioning the one or more metal sheets adjacent to a first surface of a printed circuit board (PCB), the PCB including an integrated circuit (IC) and a thermally conductive material that covers at least a portion of the first surface of the PCB and at least a portion of a second surface of the PCB opposite the first surface of the PCB; and attaching together the one or more metal sheets and the PCB to form the radar system.

Example 14: The method of example 13, wherein the waveguide channels are formed in the one or more metal sheets by use of at least one of a die or a hydroforming technique.

Example 15: The method of example 13, wherein the one or more metal sheets are attached to the PCB by a pressure-sensitive adhesive.

Example 16: The method of example 13, the method further comprising: forming the one or more metal sheets into a shield, the shield being adjacent to the IC and configured to distribute thermal energy produced at least in part by the IC away from the IC.

Example 17: The method of example 16, wherein: a termination insensitive mixer is attached to the IC; and the shield is adjacent to the IC and the termination insensitive mixer.

Example 18: The method of example 13, wherein: the IC is a monolithic microwave integrated circuit (MMIC) and is positioned on the first surface of the PCB; the PCB further includes multiple thermal vias between the first surface of the PCB and the second surface of the PCB, the multiple thermal vias configured to distribute thermal energy produced at least in part by the MMIC from the first surface of the PCB to the second surface of the PCB; and the thermally conductive material covers an inner surface of the thermal vias.

Example 19: The method of example 13, wherein the thermally conductive material and the one or more metal sheets include at least one of an aluminum alloy, stainless steel, or a copper alloy.

Example 20: The method of example 13, wherein: the one or more metal sheets comprise multiple layers; and forming the one or more metal sheets into the one or more waveguide antennas comprises connecting the multiple layers together by brazing.

CONCLUSION

While various embodiments of the disclosure are described in the foregoing description and shown in the drawings, it is to be understood that this disclosure is not limited thereto but may be variously embodied to practice within the scope of the following claims. From the foregoing description, it will be apparent that various changes may be made without departing from the scope of the disclosure as defined by the following claims.

What is claimed is:

1. A radar assembly comprising:
a printed circuit board (PCB) having a first surface and a second surface, the PCB including an integrated circuit (IC) and a thermally conductive material that covers at least a portion of the first and second surfaces of the PCB; and
a single metal sheet attached to the first surface or the second surface of the PCB, the single metal sheets-sheet configured into multiple waveguide antennas and a shield, each of the multiple waveguide antennas including multiple waveguide channels with multiple radiation slots, the multiple radiation slots being arranged in a surface of the single metal sheet through to the multiple waveguide channels, the shield being adjacent to the IC and configured to distribute thermal energy produced at least in part by the IC away from the IC.

2. The radar assembly of claim 1, wherein the thermally conductive material that covers at least a portion of the first surface of the PCB and at least a portion of the second surface of the PCB opposite the first surface of the PCB.

3. The radar assembly of claim 1, the radar assembly further comprising a termination insensitive mixer attached to the IC, wherein the shield is adjacent to the IC and the termination insensitive mixer.

4. The radar assembly of claim 2, wherein:
the IC is a monolithic microwave integrated circuit (MMIC) and is positioned on the first surface of the PCB;
the PCB further includes multiple thermal vias between the first surface of the PCB and the second surface of the PCB, the multiple thermal vias configured to distribute thermal energy produced at least in part by the MMIC from the first surface of the PCB to the second surface of the PCB; and
the thermally conductive material covers an inner surface of the thermal vias.

5. The radar assembly of claim 4, wherein the thermally conductive material also covers a first distal end and a second distal end of the thermal vias to distribute the thermal energy produced at least in part by the MMIC along the first surface of the PCB.

6. The radar assembly of claim 4, wherein a first distal end and a second distal end of the thermal vias are not covered by the thermally conductive material.

7. The radar assembly of claim 2, wherein the thermally conductive material comprises circuit traces formed of metal.

8. The radar assembly of claim 2, wherein the thermally conductive material and the one or more metal sheets include at least one of an aluminum alloy, stainless steel, or a copper alloy.

9. The radar assembly of claim 1, wherein the radar assembly is configured to be installed on an automobile to detect objects in an environment of the automobile.

10. A method of assembling a radar system, the method comprising:
   forming a single metal sheet into multiple waveguide antennas and a shield, each of the multiple waveguide antennas including multiple waveguide channels with multiple radiation slots, the multiple radiation slots being arranged in a surface of each of the multiple waveguide channels through to the multiple waveguide channels;
   positioning the single metal sheet adjacent to a first surface of a printed circuit board (PCB), the PCB including an integrated circuit (IC) and a thermally conductive material that covers at least a portion of the first surface of the PCB and at least a portion of a second surface of the PCB opposite the first surface of the PCB; and
   attaching together the single metal sheet and the PCB to form the radar system, the shield being adjacent to the IC and configured to distribute thermal energy produced at least in part by the IC away from the IC.

11. The method of claim 10, wherein the waveguide channels are formed in the single metal sheet by use of at least one of a die or a hydroforming technique.

12. The method of claim 10, wherein the single metal sheet is attached to the PCB by a pressure-sensitive adhesive.

13. The method of claim 10, wherein:
   a termination insensitive mixer is attached to the IC; and
   the shield is adjacent to the IC and the termination insensitive mixer.

14. The method of claim 10, wherein:
   the IC is a monolithic microwave integrated circuit (MMIC) and is positioned on the first surface of the PCB;
   the PCB further includes multiple thermal vias between the first surface of the PCB and the second surface of the PCB, the multiple thermal vias configured to distribute thermal energy produced at least in part by the MMIC from the first surface of the PCB to the second surface of the PCB; and
   the thermally conductive material covers an inner surface of the thermal vias.

15. The method of claim 10, wherein the thermally conductive material and the single metal sheet includes at least one of an aluminum alloy, stainless steel, or a copper alloy.

16. The method of claim 10, wherein a termination insensitive mixer is attached to the IC and is in contact with the shield.

17. A radar assembly comprising:
   a printed circuit board (PCB) having a first surface and a second surface, the PCB including an integrated circuit (IC) and a thermally conductive material that covers at least a portion of the first surface and at least a portion of the second surface of the PCB opposite the first surface of the PCB;
   a single metal sheet attached to the first surface or the second surface of the PCB, the single metal sheet being configured into multiple waveguide antennas and a shield, each of the multiple waveguide antennas including multiple waveguide channels with multiple radiation slots, the multiple radiation slots being arranged in a surface of the single metal sheet through to the multiple waveguide channels, the shield being configured to distribute thermal energy produced at least in part by the IC away from the IC; and
   a termination insensitive mixer attached to the IC;
   wherein the shield is additionally adjacent to the IC and the termination insensitive mixer.

18. The radar assembly of claim 17, wherein:
   the IC is a monolithic microwave integrated circuit (MMIC) and is positioned on the first surface of the PCB;
   the PCB further includes multiple thermal vias between the first surface of the PCB and the second surface of the PCB, the multiple thermal vias configured to distribute thermal energy produced at least in part by the MMIC from the first surface of the PCB to the second surface of the PCB; and
   the thermally conductive material covers an inner surface of the thermal vias.

19. The radar assembly of claim 18, wherein the thermally conductive material also covers a first distal end and a second distal end of the thermal vias to distribute the thermal energy produced at least in part by the MMIC along the first surface of the PCB.

20. The radar assembly of claim 18, wherein a first distal end and a second distal end of the thermal vias are not covered by the thermally conductive material.

* * * * *

UNITED STATES PATENT AND TRADEMARK OFFICE
CERTIFICATE OF CORRECTION

PATENT NO. : 12,058,804 B2
APPLICATION NO. : 17/306868
DATED : August 6, 2024
INVENTOR(S) : Scott Brandenburg et al.

Page 1 of 1

It is certified that error appears in the above-identified patent and that said Letters Patent is hereby corrected as shown below:

On the Title Page

Column 2, Item (57) Abstract, Line 9: Delete "MIMIC" and insert --MMIC-- therefor Column 2, Item (57) Abstract, Line 12: Delete "MIMIC." and insert --MMIC.-- therefor In the Claims Column 12, Line 33: In Claim 1, after "metal", delete "sheets-"

Column 12, Line 44: In Claim 2, after "material", delete "that"

Signed and Sealed this
Eighth Day of April, 2025

Coke Morgan Stewart
*Acting Director of the United States Patent and Trademark Office*